US009657182B2

(12) United States Patent
Ezoe et al.

(10) Patent No.: US 9,657,182 B2
(45) Date of Patent: May 23, 2017

(54) CURABLE RESIN COMPOSITION, PRODUCTION METHOD OF IMAGE SENSOR CHIP USING THE SAME, AND IMAGE SENSOR CHIP

(71) Applicant: FUJIFILM Corporation, Tokyo (JP)

(72) Inventors: Toshihide Ezoe, Shizuoka (JP); Yuki Nara, Shizuoka (JP); Kazuto Shimada, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 14/725,823

(22) Filed: May 29, 2015

(65) Prior Publication Data

US 2015/0259547 A1    Sep. 17, 2015

Related U.S. Application Data

(63) Continuation of application No. PCT/JP2013/081980, filed on Nov. 27, 2013.

(30) Foreign Application Priority Data

Nov. 30, 2012  (JP) .................................. 2012-263644

(51) Int. Cl.
| | |
|---|---|
| C09D 7/00 | (2006.01) |
| C09D 7/12 | (2006.01) |
| C09D 201/00 | (2006.01) |
| G02B 5/22 | (2006.01) |
| H04N 5/225 | (2006.01) |
| H01L 27/146 | (2006.01) |
| C09D 5/00 | (2006.01) |
| G02B 1/11 | (2015.01) |
| C08K 5/55 | (2006.01) |

(52) U.S. Cl.
CPC .............. *C09D 7/007* (2013.01); *C09D 5/00* (2013.01); *C09D 7/12* (2013.01); *C09D 201/00* (2013.01); *G02B 1/11* (2013.01); *G02B 5/223* (2013.01); *H01L 27/14618* (2013.01); *H01L 27/14621* (2013.01); *H01L 27/14625* (2013.01); *H01L 27/14685* (2013.01); *H04N 5/2254* (2013.01); *C08K 5/55* (2013.01); *H01L 2224/13* (2013.01)

(58) Field of Classification Search
CPC ......... H01L 27/14618; H01L 27/14621; H01L 27/14625; H01L 27/14685; C09D 5/00; C09D 7/007; C09D 7/12; C09D 201/00; G02B 1/11; G02B 5/223
USPC ........ 257/432; 438/65, 69; 359/359; 524/83, 524/92
See application file for complete search history.

(56) References Cited

U.S. PATENT DOCUMENTS

| | | | | |
|---|---|---|---|---|
| 6,174,400 B1 * | 1/2001 | Krutak, Sr. | ............ | B41M 3/144 156/238 |
| 8,766,388 B2 | 7/2014 | Ikeda et al. | | |
| 9,389,507 B2 | 7/2016 | Ikeda et al. | | |
| 2004/0004668 A1 | 1/2004 | Namazue et al. | | |
| 2004/0185588 A1 | 9/2004 | Fukuyoshi et al. | | |
| 2006/0257760 A1 | 11/2006 | Mori et al. | | |
| 2009/0035017 A1 * | 2/2009 | Tada | ...................... | G03G 5/047 399/159 |
| 2011/0070407 A1 | 3/2011 | Kato et al. | | |
| 2011/0110094 A1 * | 5/2011 | Kashiwagi | ............. | G02B 5/223 362/293 |
| 2011/0200801 A1 * | 8/2011 | Pudleiner | ................. | B41M 5/24 428/195.1 |
| 2012/0068292 A1 | 3/2012 | Ikeda et al. | | |
| 2012/0202145 A1 | 8/2012 | Arayama et al. | | |
| 2012/0243077 A1 | 9/2012 | Osawa et al. | | |
| 2012/0251831 A1 | 10/2012 | Okayasu et al. | | |
| 2014/0091419 A1 | 4/2014 | Hasegawa et al. | | |
| 2014/0252282 A1 * | 9/2014 | Erkelenz | ................... | C08K 3/04 252/587 |
| 2014/0255846 A1 | 9/2014 | Ikeda et al. | | |
| 2015/0146057 A1 * | 5/2015 | Konishi | ................... | G02B 1/04 348/294 |

FOREIGN PATENT DOCUMENTS

| | | |
|---|---|---|
| JP | 2000-190430 A | 7/2000 |
| JP | 2002-069305 A | 3/2002 |
| JP | 2003-258220 A | 9/2003 |

(Continued)

OTHER PUBLICATIONS

Communication issued on Jun. 2, 2015 by the International Searching Authority in related Application No. PCT/JP2013/081980 [English, PCT/IB/373], with attached Written Opinion and English translation thereof [PCT/ISA/237].
Communication issued Jan. 5, 2016, issued by the Japanese Patent Office in counterpart Japanese Patent Application No. 2013-245477.
Communication dated Oct. 20, 2015 issued by Japanese Intellectual Property Office in counterpart Japanese Patent Application No. 2013-245477.
Communication dated Dec. 3, 2015 issued by European Patent Office in counterpart European Patent Application No. 13858731.6.
Notification of Information Offer issued May 24, 2016, by the Japanese Patent Office in counterpart Japanese Patent Application No. 2013-245477.

(Continued)

*Primary Examiner* — Victor A Mandala
*Assistant Examiner* — Colleen E Snow
(74) *Attorney, Agent, or Firm* — Sughrue Mion, PLLC

(57) ABSTRACT

There is provided a curable resin composition which is capable of being coated so as to have a film thickness of 20 μm or more and contains a dye having a maximum absorption wavelength in a wavelength range from 600 to 850 nm, and the infrared ray cut filter having a dye-containing layer having a film thickness of 20 μm or more formed from the curable resin composition, and a production method of image sensor chip comprising a step of coating the curable resin composition on a glass substrate to form a dye-containing layer, and a step of adhering the glass plate having the dye-containing layer formed on a solid-state imaging device substrate.

34 Claims, 3 Drawing Sheets

(56) References Cited

FOREIGN PATENT DOCUMENTS

| | | |
|---|---|---|
| JP | 2004-096390 A | 3/2004 |
| JP | 2004-200360 A | 7/2004 |
| JP | 2005-092195 A | 4/2005 |
| JP | 2008-070828 A | 3/2008 |
| JP | 2008-91535 A | 4/2008 |
| JP | 2008-268267 A | 11/2008 |
| JP | 2008-303308 A | 12/2008 |
| JP | 2010-152256 A | 7/2010 |
| JP | 2011-068731 A | 4/2011 |
| JP | 2011-100084 A | 5/2011 |
| JP | 2011-213969 A | 10/2011 |
| JP | 2012-8532 A | 1/2012 |
| JP | 2012-021066 A | 2/2012 |
| JP | 2012-028620 A | 2/2012 |
| JP | 2012-047582 A | 3/2012 |
| JP | 2012-185468 A | 9/2012 |
| JP | 2013-41141 A | 2/2013 |
| KR | 92-0007677 B1 | 9/1992 |
| TW | 201219978 A1 | 5/2012 |
| WO | 2009/145065 A1 | 12/2009 |
| WO | 2011/071052 A1 | 6/2011 |
| WO | 2011/074619 A1 | 6/2011 |
| WO | 2012/169447 A1 | 12/2012 |

OTHER PUBLICATIONS

Notification of Information Offer dated Jun. 7, 2016 issued by the Japanese Patent Office in counterpart Japanese Patent Application No. 2013-245477.
Japan Seeders Service, Small test equipment, Baker type applicator <http://nss-japan.jimdo.com/>, accessed Apr. 26, 2016, 2 pgs. total.
DKSH Japan, K.K., Film applicator, Baker type http://www.surfacetest.ip/, accessed Apr. 26, 2016; 4 pgs. total.
Yasuda Seiki Seisakusho, Ltd., Baker type film applicator http://www.vasuda-seiki.co.ip/products/510.html, accessed Apr. 26, 2016; 2 pgs. total.
Masaru Matsuoka, Joem Handbook 2, Absorption Spectra of Dyes for Diode Lasers, Bunshin Publishing Co., Tokyo Japan, 1990; pp. 63-64; 2 pgs. total.
Office Action dated Aug. 2, 2016 issued by the State Intellectual Property Office of People's Republic China in counterpart Chinese Patent Application No. 201380062266.2.
Office Action dated Sep. 6, 2016 issued by the Japanese Patent Office in counterpart Japanese Patent Application No. 2013-245477.
Search Report dated Feb. 25, 2014, issued by the International Searching Authority in counterpart International Application No. PCT/JP2013/081980.
Korean Office Action dated Dec. 19, 2016 issued by the Korean Intellectual Property Office in counterpart Korean Patent Application No. 10-2015-7012594.
Machine translation of JP 2005-092195.
Office Action dated Feb. 7, 2017, issued by the Taiwanese Patent Office in counterpart Taiwanese Application No. 102143790.
Notification of Information Offer, dispatched Mar. 14, 2017 in corresponding Japanese Application No. 2013-245477, 44 pages in English and Japanese.
Office Action in counterpart Japanese Application No. 2013-245477 dated Apr. 4, 2017.

* cited by examiner

CURABLE RESIN COMPOSITION, PRODUCTION METHOD OF IMAGE SENSOR CHIP USING THE SAME, AND IMAGE SENSOR CHIP

CROSS REFERENCE TO RELATED APPLICATION

This is a continuation of International Application No. PCT/JP2013/081980 filed on Nov. 27, 2013, and claims priority from Japanese Patent Application No. 2012-263644 filed on Nov. 30, 2012, the entire disclosures of which are incorporated herein by reference.

TECHNICAL FIELD

The present invention relates to a curable resin composition, a production method of image sensor chip using the same, and an image sensor chip.

BACKGROUND ART

A CCD or CMOS image sensor chip (hereinafter, simply referred to as an "image sensor chip") which is a solid-state imaging device for color image is used in a video camera, a digital still camera, a cellular phone with camera function and the like. Since the solid-state imaging device uses a silicon photodiode having sensitivity to near infrared ray in the light receiving unit thereof, luminosity factor correction is required and an infrared ray cut filter is employed (for example, see Patent Document 1).

RELATED ART DOCUMENT

Patent Document

Patent Document 1: JP-A-2012-28620

DISCLOSURE OF THE INVENTION

Problems that the Invention is to Solve

However, when a surface of the solid-state imaging device substrate and the infrared ray cut filter are faced with a space as described above, incident angle dependence of light which the solid-state imaging device receives increases to cause a problem of color shading in some cases.

The invention has been made in the light of the circumstances described above, and it is a problem of the invention to achieve the objects described below.

Specifically, an object of the invention is to provide a curable resin composition capable of producing an image sensor chip in which the color shading is suppressed.

Also, another object of the invention is to provide a curable resin composition which can produce an image sensor chip in which a stack functioning as an infrared ray cut filter and including a layer containing a dye having a maximum absorption wavelength in a wavelength range from 600 to 850 nm (hereinafter, also simply referred to as a "dye-containing layer"), an infrared ray reflecting film and the like and a surface of a solid-state imaging device substrate are closely contacted with each other without a space and by which the incident angle dependence of light received can be suppressed, a production method of image sensor chip using the same, and an image sensor chip.

Means for Solving the Problems

The invention has the configuration described below, and the objects of the invention described above are achieved thereby.

[1] A curable resin composition which is capable of being coated so as to have a film thickness of 20 μm or more and contains a dye having a maximum absorption wavelength in a wavelength range from 600 to 850 nm.

[2] The curable resin composition as described in [1], wherein the dye is at least one kind selected from the group consisting of a pyrrolopyrrole dye, a copper complex, a cyanine-based dye, a phthalocyanine-based dye, a quaterrylene-based dye, an aminium-based dye, an imminium-based dye, an azo-based dye, an anthraquinone-based dye, a diimonium-based dye, a squarylium-based dye and a porphyrin-based dye.

[3] The curable resin composition as described in [1], wherein the dye is a pyrrolopyrrole dye or a copper complex.

[4] The curable resin composition as described in any one of [1] to [3], which has a solid content concentration from 10 to 90% by mass and a viscosity at 25° C. from 1 mPa·s to 1,000 Pa·s.

[5] The curable resin composition as described in any one of [1] to [4], which further contains a polymerizable compound and a solvent, and a content of the dye in a total solid content of the composition is 30% by mass or more.

[6] A curable resin composition which contains a dye having a maximum absorption wavelength in a wavelength range from 600 to 850 nm and has a solid content concentration from 10 to 90% by mass and a viscosity at 25° C. from 1 mPa·s to 1,000 Pa·s.

[7] An infrared ray cut filter having a dye-containing layer having a film thickness of 20 μm or more formed from the curable resin composition as described in any one of [1] to [6].

[8] An infrared ray cut filter having a first dye-containing layer containing a copper complex and a second dye-containing layer containing a pyrrolopyrrole dye.

[9] The infrared ray cut filter as described in [8], wherein a film thickness of the first dye-containing layer is 50 μm or more and a film thickness of the second dye-containing layer is 5 μm or less.

[10] A production method of image sensor chip comprising a step of coating the curable resin composition as described in any one of [1] to [6] on a glass substrate to form a dye-containing layer, and a step of adhering the glass plate having the dye-containing layer formed on a solid-state imaging device substrate.

[11] The production method of image sensor chip as described in [10], wherein the coating of the curable resin composition is applicator coating and the applicator coating is performed by setting a solid content concentration and a viscosity of the curable resin composition to from 40 to 70% by mass and 300 to 700 mPa·s, respectively.

[12] The production method of image sensor chip as described in [10] or [11], wherein the glass substrate further has an infrared ray reflecting film, and (1) a surface of the glass substrate on which the infrared ray reflecting film is formed is adhered on the solid-state imaging device substrate or (2) a surface of the glass substrate on which the infrared ray reflecting film is not formed is adhered on the solid-state imaging device substrate.

[13] The production method of image sensor chip as described in any one of [10] to [12], wherein the glass substrate further has an antireflection film.

[14] The production method of image sensor chip as described in [13],
wherein the infrared ray reflecting film is present on one surface of the glass substrate and the antireflection film is present on the other surface of the glass substrate.

[15] The production method of image sensor chip as described in any one of [12] to [14],
wherein the infrared ray reflecting film is a dielectric multilayer film.

[16] The production method of image sensor chip as described in any one of [10] to [15],
wherein the solid-state imaging device substrate has a color filter layer, a high refractive index layer and a low refractive index layer.

[17] An image sensor chip comprising a solid-state imaging device substrate, a dye-containing layer composed of the curable resin composition as described in any one of [1] to [6] and a glass substrate having an infrared ray reflecting film, wherein these are closely contacted with each other without intervention of an air layer.

[18] The image sensor chip as described in [17],
wherein the infrared ray reflecting film is provided on a surface of the glass substrate opposed to the dye-containing layer composed of the curable resin composition.

[19] The image sensor chip as described in [17],
wherein the dye-containing layer is provided between the infrared ray reflecting film and the glass substrate.

[20] The image sensor chip as described in any one of [17] to [19],
wherein an antireflection film is further provided on an outermost surface of the image sensor chip comprising the solid-state imaging device substrate, the dye-containing layer and the infrared ray reflecting film.

Advantage of the Invention

According to the invention, a curable resin composition capable of producing an image sensor chip in which the color shading is suppressed can be provided.

Also, a curable resin composition which can produce an image sensor chip in which a stack functioning as an infrared ray cut filter and including a dye-containing layer, an infrared ray reflecting film and the like and a surface of a solid-state imaging device substrate are closely contacted with each other without a space and by which the incident angle dependence of light received can be suppressed, a production method of image sensor chip using the same, and an image sensor chip can be provided.

MODE FOR CARRYING OUT THE INVENTION

Figure 1:
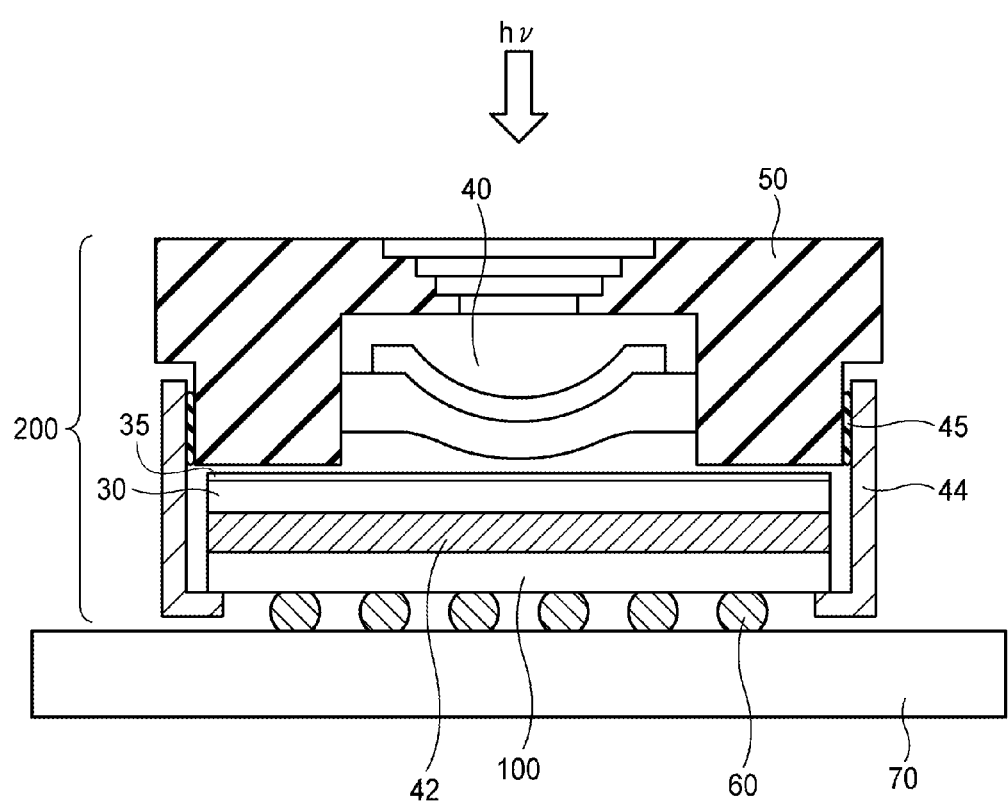
FIG. 1 is a schematic cross-sectional view showing the configuration of a camera module equipped with the solid-state imaging device according to an embodiment of the invention.

The polymerizable composition according to the invention will be described in detail hereinafter.

With respect to the description of a group (an atomic group) in the specification, when the group is indicated without specifying whether substituted or unsubstituted, the group includes both a group having no substituent and a group having a substituent. For example, "an alkyl group" includes not only an alkyl group having no substituent (an unsubstituted alkyl group) but also an alkyl group having a substituent (a substituted alkyl group). Also, in the specification, a viscosity value denotes a value at 25° C.

The curable resin composition according to the invention is capable of being coated so as to have a film thickness of 20 μm or more and contains a dye having a maximum absorption wavelength in a wavelength range from 600 to 850 nm.

The maximum absorption wavelength of the dye is based on a value obtained by measuring a film having a film thickness of 1 μm obtained by coating a solution prepared so as to have a content of the dye and a resin of 20% by mass based on the total solution using a spectrophotometer.

The curable resin composition according to the invention may be a heat-curable resin composition or a photocurable resin composition.

The solid-state imaging device substrate according to the invention preferably includes a color filter layer, a high refractive index layer and a low refractive index layer, as described later with reference to FIG. 1 and FIG. 2.

The constitution of the curable resin composition according to the invention is described below.

The description of the constituent element below is made based on the typical embodiment of the invention in some cases, but the invention should not be construed as being limited thereto. In the specification, a numerical value range represented by using the term "to" means a range which includes the numerical values described before and after the term "to" as a lower limit and an upper limit, respectively.

In the specification, the term "(meth)acrylate" represents acrylate and methacrylate, the term "(meth)acryl" represents acryl and methacryl, and the term "(meth)acryloyl" represents acryloyl and methacryloyl. Also, in the specification, the terms "monomer" and "monomer" have the same meaning. The monomer in the invention is distinguished from an oligomer and a polymer and means a compound having a mass average molecular weight of 2,000 or less. In the specification, a polymerizable compound means a compound having a polymerizable group and may be a monomer or a polymer. The polymerizable group means a group involved in a polymerization reaction.

[1] Dye having maximum absorption wavelength in wavelength range from 600 to 850 nm The dye which can be used in the invention is not particularly limited so long as it has a maximum absorption wavelength (λmax) in a wavelength range from 600 to 850 nm and preferably includes, for example, at least one kind selected from the group consisting of a pyrrolopyrrole dye, a copper complex, a cyanine-based dye, a phthalocyanine-based dye, a quaterrylene-based dye, an aminium-based dye, an imminium-based dye, an azo-based dye, an anthraquinone-based dye, a diimonium-based dye, a squarylium-based dye and a porphyrin-based dye. Among them, a pyrrolopyrrole dye, a copper complex, a cyanine-based dye, a phthalocyanine-based dye or a quaterrylene-based dye is preferred, and a pyrrolopyrrole dye, a copper complex, a cyanine-based dye or a phthalocyanine-based dye is more preferred.

As the dye, at least one kind selected from the group consisting of a cyanine-based dye, a phthalocyanine-based dye, a quaterrylene-based dye, an aminium-based dye, an imminium-based dye, an azo-based dye, an anthraquinone-based dye, a diimonium-based dye, a squarylium-based dye and a porphyrin-based dye is also one preferred embodiment.

By the way, in a soldering process in the production of electronic component and the like used in a cellular phone and the like, a conventional process wherein a solder is molten to attach to a substrate surface has been replacing with a so-called solder reflow process. In the solder reflow process, ordinarily, after mounting components having a solder preliminarily printed on a substrate surface by means of printing or the like, soldering is performed in a reflow furnace. This technique is advantageous in view of response to miniaturization of the electronic component and productivity, and is effective in the production of camera module which is reduced in size and weight. In the case of performing the solder reflow process, since the reflow furnace is heated with hot air, a far infrared ray or the like, a member subjected to the process is required to have heat resistance capable of responding to the reflow temperature.

From the above, in order to reduce the size and weight of camera module or the like, it is necessary to study the response to a so-called reflowing wherein the production is accompanied with the solder flow process.

In particular, from the standpoint of the heat resistance endurable the reflow process, the pyrrolopyrrole dye and copper complex are preferred.

When the maximum absorption wavelength is less than 600 nm or when the maximum absorption wavelength is more than 850 nm, the shielding property to a near infrared ray having a wavelength around 700 nm is low so that a satisfactory result cannot be obtained.

The maximum absorption wavelength of the dye for use in the invention is preferably in a range from 600 to 800 nm, more preferably in a range from 640 to 770 nm, and particularly preferably in a range from 660 to 720 nm.

As the pyrrolopyrrole dye, a compound represented by formula (A1) shown below is more preferred.
Formula (A1)

[Chem. 1]

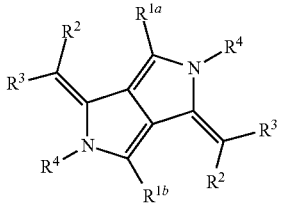

In formula (A1), $R^{1a}$ and $R^{1b}$ each independently represents an alkyl group, an aryl group or a heteroaryl group. $R^2$ and $R^3$ each independently represents a hydrogen atom or a substituent, and at least one of $R^2$ and $R^3$ is an electron withdrawing group, or $R^2$ and $R^3$ may be combined with each other to form a ring. $R^4$ represents a hydrogen atom, an alkyl group, an aryl group, a heteroaryl group, a substituted boron or a metal atom, or $R^4$ may be covalently connected or coordinately connected with at least one of $R^{1a}$, $R^{1b}$ and $R^3$.

In formula (A1), the alkyl group represented by each of $R^{1a}$ and $R^{1b}$ is preferably an alkyl group having from 1 to 30 carbon atoms, more preferably an alkyl group having from 1 to 20 carbon atoms, and particularly preferably an alkyl group having from 1 to 10 carbon atoms.

The aryl group represented by each of $R^{1a}$ and $R^{1b}$ is preferably an aryl group having from 6 to 30 carbon atoms, more preferably an aryl group having from 6 to 20 carbon atoms, and particularly preferably an aryl group having from 6 to 12 carbon atoms.

The heteroaryl group represented by each of $R^{1a}$ and $R^{1b}$ is preferably a heteroaryl group having from 1 to 30 carbon atoms, and more preferably a heteroaryl group having from 1 to 12 carbon atoms. As the hetero atom, for example, a nitrogen atom, an oxygen atom and a sulfur atom are exemplified.

In particular, as the group represented by each of $R^{1a}$ and $R^{1b}$, an aryl group having an alkoxy group having a branched alkyl group is preferred. The alkyl group in the branched alkyl group preferably has from 3 to 30 carbon atoms, and more preferably has from 3 to 20 carbon atoms.

As the group represented by each of $R^{1a}$ and $R^{1b}$, for example, 4-(2-ethylhexyloxy)phenyl, 4-(2-methylbutyloxy)phenyl or 4-(2-octyldodecyloxy)phenyl is particularly preferred.

In formula (A1), $R^{1a}$ and $R^{1b}$ may be the same or different from each other.

$R^2$ and $R^3$ each independently represents a hydrogen atom or a substituent T, and at least one of $R^2$ and $R^3$ is an electron withdrawing group, or $R^2$ and $R^3$ may be combined with each other to form a ring. In particular, $R^2$ and $R^3$ each independently preferably represents a cyano group or a heterocyclic group.

The substituent T includes, for example, those described below.

An alkyl group (preferably having from 1 to 30 carbon atoms), an alkenyl group (preferably having from 2 to 30 carbon atoms), an alkynyl group (preferably having from 2 to 30 carbon atoms), an aryl group (preferably having from 6 to 30 carbon atoms), an amino group (preferably having from 0 to 30 carbon atoms), an alkoxy group (preferably having from 1 to 30 carbon atoms), an aryloxy group (preferably having from 6 to 30 carbon atoms), an aromatic heterocyclic oxy group (preferably having from 1 to 30 carbon atoms), an acyl group (preferably having from 1 to 30 carbon atoms), an alkoxycarbonyl group (preferably having from 2 to 30 carbon atoms), an aryloxycarbonyl group (preferably having from 7 to 30 carbon atoms), an acyloxy group (preferably having from 2 to 30 carbon atoms), an acylamino group (preferably having from 2 to 30 carbon atoms), an alkoxycarbonylamino group (preferably having from 2 to 30 carbon atoms), an aryloxycarboylamino group (preferably having from 7 to 30 carbon atoms), a sulfonylamino group (preferably having from 1 to 30 carbon atoms), a sulfamoyl group (preferably having from 0 to 30 carbon atoms), a carbamoyl group (preferably having from 1 to 30 carbon atoms), an alkylthio group (preferably having from 1 to 30 carbon atoms), an arylthio group (preferably having from 6 to 30 carbon atoms), an aromatic heterocyclic thio group (preferably having from 1 to 30 carbon atoms), a sulfonyl group (preferably having from 1 to 30 carbon atoms), a sulfinyl group (preferably having from 1 to 30 carbon atoms), a ureido group (preferably having from 1 to 30 carbon atoms), a phosphoramido group (preferably having from 1 to 30 carbon atoms), a hydroxy group, a mercapto group, a halogen atom, a cyano group, a sulfo group, a carboxyl group, a nitro group, a hydroxamic acid group, a sulfino group, a hydrazino group, an imino group and a heterocyclic group (preferably having from 1 to 30 carbon atoms).

Among $R^2$ and $R^3$, at least one of $R^2$ and $R^3$ is an electron withdrawing group. A substituent having a positive Hammett's σp value (sigma para value) ordinarily functions as an electron withdrawing group. Examples of the electron withdrawing group include a cyano group, an acyl group, an alkyloxycarbonyl group, an aryloxycarbonyl group, a sulfamoyl group, a sulfinyl group and a heterocyclic group, and a cyano group is more preferred. The electron withdrawing group may be further substituted.

According to the invention, a substituent having a Hammett's substituent constant σp value of at least 0.2 or more can be exemplified as an electron withdrawing group. The $\sigma_p$ value is preferably 0.25 or more, more preferably 0.3 or more, and particularly preferably 0.35 or more. The upper limit thereof is not particularly limited, and is preferably 0.80.

Specific examples thereof include a cyano group (0.66), a carboxyl group (—COOH: 0.45), an alkoxycarbonyl group (—COOMe: 0.45), an aryloxycarbonyl group (—COOPh: 0.44), a carbamoyl group (—CONH$_2$: 0.36), an alkylcarbonyl group (—COMe: 0.50), an arylcarbonyl group (—COPh: 0.43), an alkylsulfonyl group (—SO$_2$Me: 0.72) and an arylsulfonyl group (—SO$_2$Ph: 0.68). A cyano group is particularly preferred. In the above, Me represents a methyl group and Ph represents a phenyl group.

The Hammett's substituent constant σ value can refer to, for example, paragraphs 0017 to 0018 of JP-A-2011-68731, and the contents thereof are incorporated into the specification.

In the case where $R^2$ and $R^3$ are combined with each other to form a ring, it is preferred to from a 5-membered to 7-membered ring (preferably a 5-membered or 6-membered ring). As the ring formed, a ring which is ordinarily used as an acidic nucleus in a merocyanine dye is preferred, and specific examples thereof can refer to, for example, paragraphs 0019 to 0021 of JP-A-2011-68731, and the contents thereof are incorporated into the specification.

$R^3$ is particularly preferably a hetero ring. In particular, $R^3$ is preferably quinoline, benzothiazole or naphthothiazole.

In formula (A1), two groups represented by $R^2$ may be the same or different from each other, and two groups represented by $R^3$ may be the same or different from each other.

In the case where the group represented by $R^4$ is the alkyl group, the aryl group or the heteroaryl group, these groups have the same meanings as those described for $R^{1a}$ and $R^{1b}$, respectively and preferred groups are also the same.

In the case where the group represented by $R^4$ is the substituted boron, the substituent has the same meaning as the substituent T described for $R^2$ and $R^3$, and is preferably an alkyl group, an aryl group or a heteroaryl group.

In the case where the group represented by $R^4$ is the metal atom, the metal atom is preferably a transition metal, particularly preferably a substituted boron. As the substituted boron, difluoro boron, diphenyl boron, dibutyl boron, dinaphthyl boron and catechol boron are preferably exemplified. Among them, diphenyl boron is particularly preferred.

$R^4$ may be covalently connected or coordinately connected with at least one of $R^{1a}$, $R^{1b}$ and $R^3$, and it is particularly preferred that $R^4$ is coordinately connected with $R^3$.

In particular, $R^4$ is preferably a hydrogen atom or a substituted boron (particularly diphenyl boron).

In formula (A1), two groups represented by $R^4$ may be the same or different from each other.

The compound represented by formula (A1) can refer to, for example, paragraphs 0024 to 0052 of JP-A-2011-68731 (corresponding to paragraphs 0043 to 0074 of U.S. Patent Publication No. 2011/0070407), and the contents thereof are incorporated into the specification.

As the pyrrolopyrrole dye, a compound represented by formula (A2) shown below is more preferred, and a compound represented by formula (A3) shown below is still more preferred. Formula (A2)

[Chem. 2]

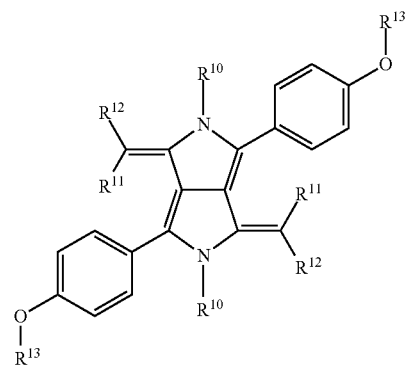

In formula (A2), $R^{10}$ each independently represents a hydrogen atom, an alkyl group, an aryl group, a heteroaryl group, a substituted boron or a metal atom, or $R^{10}$ may be covalently connected or coordinately connected with $R^{12}$. $R^{11}$ and $R^{12}$ each independently represents a hydrogen atom or a substituent, and at least one of $R^{11}$ and $R^{12}$ is an electron withdrawing group, or $R^{11}$ and $R^{12}$ may be combined with each other to form a ring. $R^{13}$ each independently represents a branched alkyl group having from 3 to 30 carbon atoms.

$R^{10}$ has the same meanings as $R^4$ in formula (A1) above, and preferred ranges are also the same.

$R^{11}$ and $R^{12}$ have the same meanings as $R^2$ and $R^3$ in formula (A1) above, and preferred ranges are also the same.

$R^{13}$ may be the same or different from each other.

Also, $R^{13}$ is preferably an alcohol residue derived, for example, from isoeicosanol (FINEOXOCOL 2000 produced by Nissan Chemical Industries, Ltd.).

The alcohol may be straight-chain or branched and is preferably an alcohol having from 1 to 30 carbon atoms, more preferably an alcohol having from 3 to 25 carbon atoms, and particularly preferably a branched alcohol having from 3 to 25 carbon atoms. More specifically, methanol, ethanol, isopropanol, n-butanol, tert-butanol, 1-octanol, 1-decanol, 1-hexadecanol, 2-methylbutanol, 2-ethylhexanol, 2-octyldodecanol, isohexadecanol (FINEOXOCOL 1600 produced by Nissan Chemical Industries, Ltd.), isooctadecanol (FINEOXOCOL 180 produced by Nissan Chemical Industries, Ltd.), isooctadecanol (FINEOXOCOL 180N produced by Nissan Chemical Industries, Ltd.), isooctadecanol (FINEOXOCOL 180T produced by Nissan Chemical Industries, Ltd.), isoeicosanol (FINEOXOCOL 2000 produced by Nissan Chemical Industries, Ltd.) and the like are exemplified. The alcohol may be a mixture of two or more thereof.

Formula (A3)

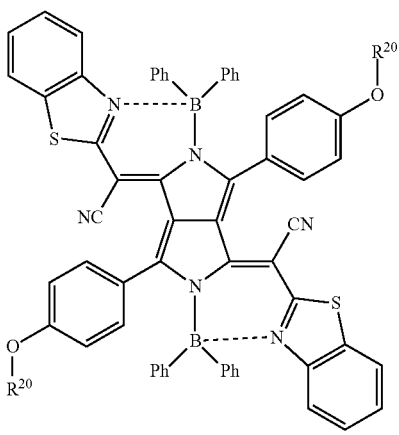

In formula (A3), $R^{20}$ each independently represents a branched alkyl group having from 3 to 30 carbon atoms.

In formula (3A), $R^{20}$ has the same meanings as $R^{13}$ in formula (A2) above, and preferred ranges are also the same.

In the case where the dye is the copper complex, the ligand L coordinated to the copper is not particularly limited so long as it is able to coordinate with a copper ion, and includes, for example, a compound having sulfonic acid, carboxylic acid, phosphoric acid, a phosphoric acid ester, phosphonic acid, a phosphonic acid ester, phosphinic acid, a substituted phosphinic acid, a carbonyl (ester, ketone), an amine, an amide, a sulfonamide, a urethane, a urea, an alcohol, a thiol or the like.

Specific examples of the copper complex include a phosphorus-containing copper compound, a copper sulfonate compound and a copper compound represented by formula (B) shown below. The phosphorus-containing copper compound specifically can refer to, for example, compounds described from line 27 on page 5 to line 20 on page 7 of WO 2005/030898, and the contents thereof are incorporated into the specification.

As the copper complex, for example, a copper complex represented by formula (B) shown below is exemplified.

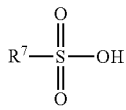 Formula (B)

In formula (B), X represents a ligand coordinated to the copper, and n1 each independently represents an integer from 1 to 6.

The ligand X includes a ligand having a substituent containing C, N, O or S as an atom capable of coordinating to the copper, and is more preferably a ligand including a group having a lone pair, for example, N, O or S. The group capable of coordinating is not limited to one kind in the molecule, two or more kinds thereof may be incorporated, and it may be dissociated or non-dissociated.

The copper complex is a copper compound in which ligands are coordinated to the copper as the central metal, and the copper is ordinarily a divalent copper. The copper complex can be obtained, for example, by mixing, reacting and the like a compound for forming the ligand or a salt thereof with a copper component.

The compound for forming the ligand or a salt thereof is not particularly limited, and preferably includes, for example, an organic acid compound (for example, a sulfonic acid compound or a carboxylic acid compound) and a salt thereof.

In particular, a sulfonic acid compound represented by formula (J) shown below or a salt thereof is preferred.

Formula (J)

[Chem. 4]

$$R^7 - \overset{\overset{\displaystyle O}{\|}}{\underset{\underset{\displaystyle O}{\|}}{S}} - OH$$

In formula (J), $R^7$ represents a monovalent organic group.

Specifically, the monovalent organic group is not particularly limited, and includes, for example, a straight-chain, branched or cyclic alkyl group, an alkenyl group and an aryl group. These groups may be intervened by a divalent connecting group (for example, an alkylene group, a cycloalkylene group, an arylene group, —O—, —S—, —CO—, —C(=O)O—, —OCO—, —SO$_2$— or —NR— (wherein R represents a hydrogen atom or an alkyl group). The monovalent organic group may have a substituent.

The straight-chain or branched alkyl group is preferably an alkyl group having from 1 to 20 carbon atoms, more preferably an alkyl group having from 1 to 12 carbon atoms, and still more preferably an alkyl group having from 1 to 8 carbon atoms.

The cyclic alkyl group may be monocyclic or polycyclic. The cyclic alkyl group is preferably a cycloalkyl group having from 3 to 20 carbon atoms, more preferably a cycloalkyl group having from 4 to 10 carbon atoms, and still more preferably a cycloalkyl group having from 6 to 10 carbon atoms. The alkenyl group is preferably an alkenyl group having from 2 to 10 carbon atoms, more preferably an alkenyl group having from 2 to 8 carbon atoms, and still more preferably an alkenyl group having from 2 to 4 carbon atoms.

The aryl group is preferably an aryl group having from 6 to 18 carbon atoms, more preferably an aryl group having from 6 to 14 carbon atoms, and still more preferably an aryl group having from 6 to 10 carbon atoms.

The alkylene group, cycloalkylene group and arylene group as the divalent connecting group include divalent connecting groups derived by eliminating one hydrogen atom from the alkyl group, the cycloalkyl group and the aryl group described above, respectively.

The substituent which the monovalent organic group may have includes an alkyl group, a polymerizable group (for example, a vinyl group, a (meth)acryloyl group, an epoxy group or an oxetane group), a halogen atom, a carboxyl group, a carboxylic ester group (for example, —CO$_2$CH$_3$), a hydroxy group, an amido group and a halogenated alkyl group (for example, a fluoroalkyl group or a chloroalkyl group).

The molecular weight of the sulfonic acid compound represented by formula (J) or the salt thereof is preferably from 80 to 750, more preferably from 80 to 600, and still more preferably from 80 to 450.

Specific examples of the sulfonic acid compound represented by formula (J) are set forth below, but the invention should not be construed as being limited thereto.

[Chem. 5]
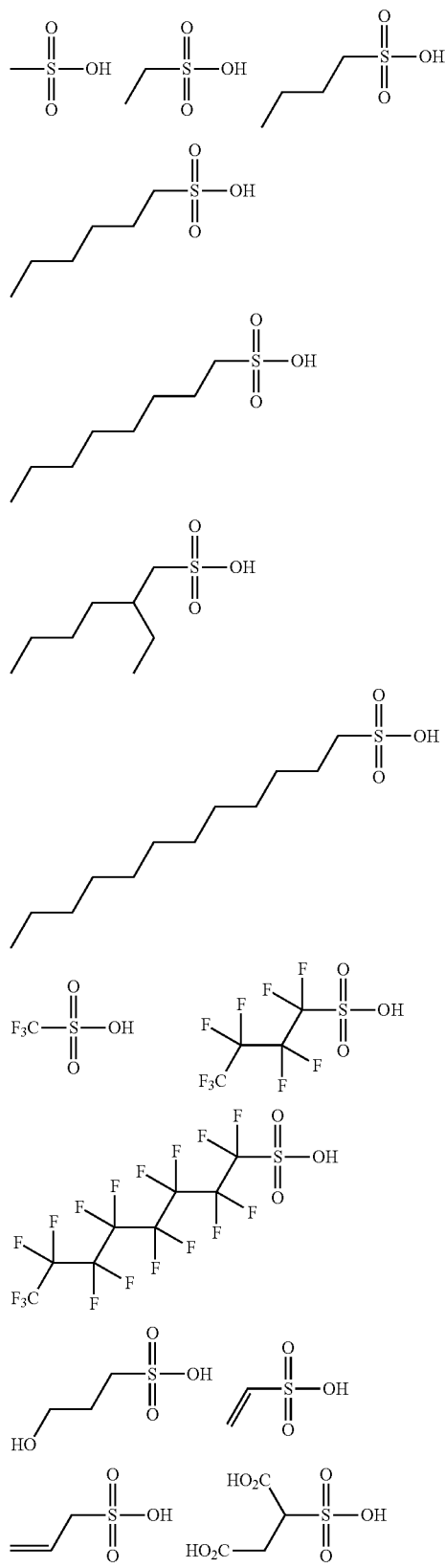
[Chem. 6]
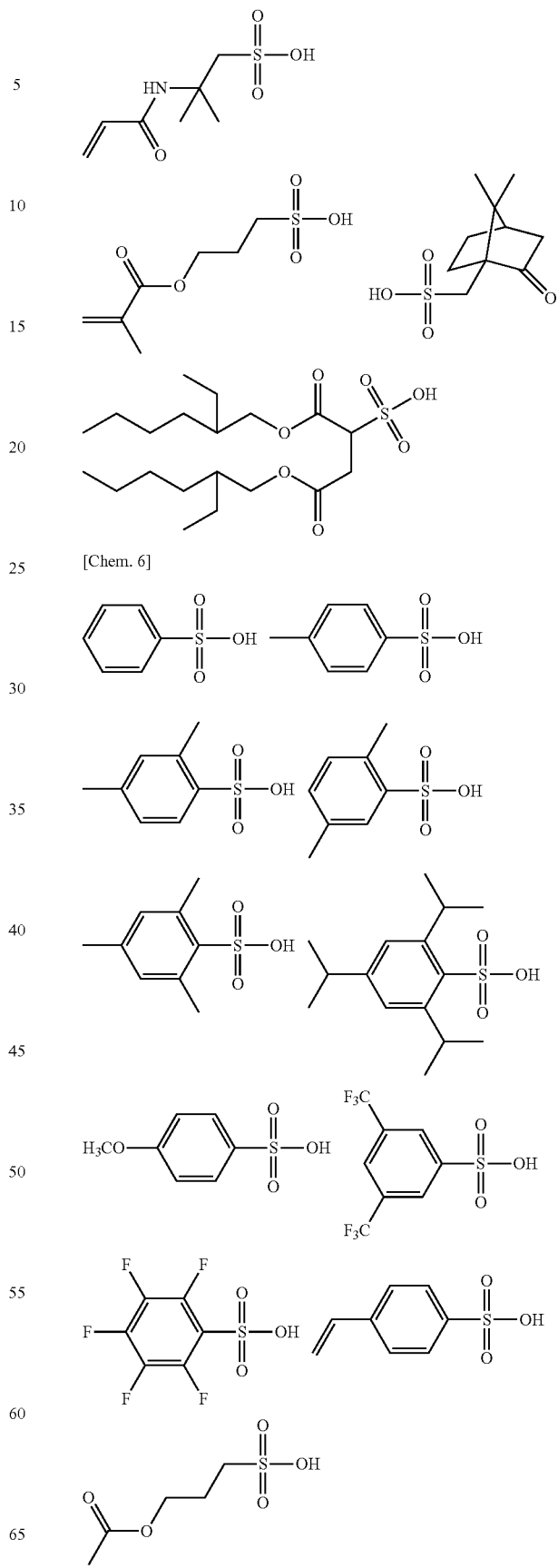

-continued

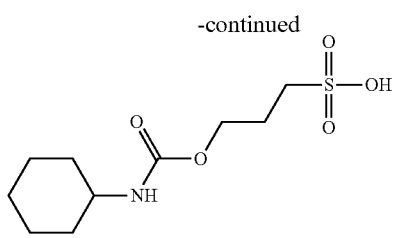

The sulfonic acid compound can be used a commercially available sulfonic acid compound or can be synthesized with reference to a known method. The salt of the sulfonic acid compound includes, for example, a metal salt, and specifically includes, for example, a sodium salt and a potassium salt.

As another copper complex, a copper complex containing a carboxylic acid as the ligand other than those described above. For example, a copper complex containing a compound represented by formula (K) shown below as the ligand can be used.

Formula (K)

[Chem. 7]

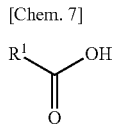

In formula (K), $R^1$ represents a monovalent organic group.

In formula (K), $R^1$ represents a monovalent organic group. The monovalent organic group is not particularly limited, and, for example, has the same meaning as the monovalent organic group in formula (J) described above.

<Copper Complex (Polymer Type)>

The copper complex may be a copper complex obtained by a reaction between a copper component and a polymer compound having a repeating unit represented by formula (II) shown below or a salt thereof (hereinafter, also simply referred to as a "compound represented by formula (II)").

The copper component is not particularly limited so long as it is capable of forming a compound exhibiting a near infrared ray absorbing property by reacting with the compound represented by formula (II) shown below, and preferably includes copper hydroxide, copper acetate and copper sulfate.

(Polymer compound having repeating unit represented by formula (II) shown below or salt thereof)

The polymer compound or salt thereof, which is reacted with the copper component, has a repeating unit represented by formula (II) shown below.

[Chem. 8]

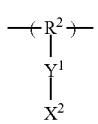

(II)

In formula (II), $R^2$ represents an organic group, $Y^1$ represents a single bond or a divalent connecting group, and $X^2$ represents an acid group.

In formula (II), $R^2$ is preferably a group containing an aliphatic hydrocarbon group, an aromatic hydrocarbon group and/or an aromatic heterocyclic group.

In formula (II), in the case where $Y^1$ represents a divalent connecting group, the divalent connecting group includes a divalent hydrocarbon group, a heteroarylene group, —O—, —S—, —CO—, —COO—, —OCO—, —SO$_2$—, —NX— (wherein X represents a hydrogen atom or an alkyl group, and is preferably a hydrogen atom), and a group formed by a combination of these groups.

The divalent hydrocarbon group includes a straight-chain, branched or cyclic alkylene group and an arylene group. Although the hydrocarbon group may have a substituent, it is preferred to be unsubstituted.

The carbon number of the straight-chain alkylene group is preferably from 1 to 30, more preferably from 1 to 15, and still more preferably from 1 to 6. The carbon number of the branched alkylene group is preferably from 3 to 30, more preferably from 3 to 15, and still more preferably from 3 to 6. The cyclic alkylene group may be monocyclic or polycyclic. The carbon number of the cyclic alkylene group is preferably from 3 to 20, more preferably from 4 to 10, and still more preferably from 6 to 10.

The carbon number of the arylene group is preferably from 6 to 18, more preferably from 6 to 14, and still more preferably from 6 to 10. A phenylene group is particularly preferred as the arylene group.

The heteroarylene group is preferably a 5-membered ring or a 6-membered ring. The heteroarylene group may be monocyclic or polycyclic, and is preferably monocyclic or a condensed ring having from 2 to 8 rings, and more preferably monocyclic or a condensed ring having from 2 to 4 rings.

In formula (II), $X^2$ represents an acid group, and is preferably a carboxylic acid group or a sulfonic acid group, and more preferably a sulfonic acid group.

According to a first embodiment of the compound represented by formula (II), the polymer compound is a polymer containing a carbon-carbon bond in the main chain thereof, and preferably contains a repeating unit represented by formula (II-1A) shown below, and more preferably contains a repeating unit represented by formula (II-1B) shown below.

[Chem. 9]

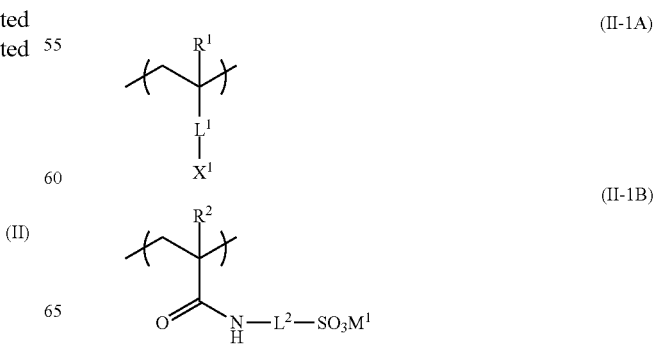

In formula (II-1A), $R^1$ represents a hydrogen atom or a methyl group, $L^1$ represents a single bond or a divalent connecting group, and $X^1$ represents an acid group.

In formula (II-1B), $R^2$ represents a hydrogen atom or a methyl group, $L^2$ represents a divalent connecting group, and $M^1$ represents a hydrogen atom or an atom or atomic group constituting a salt with the sulfonic acid group.

In formula (II-1A) and formula (II-1B), $R^1$ and $R^2$ each independently preferably represents a hydrogen atom.

In the case where $L^1$ and $L^2$ each represents a divalent connecting group in formula (II-1A) and formula (II-1B), the divalent connecting group has the same meaning as the divalent connecting group represented by $Y^1$ described above, and preferred ranges are also the same.

In formula (II-1A), $X^1$ has the same meaning as $X^2$ in formula (II) above, and preferred ranges are also the same.

In formula (II-1B), $M^1$ is preferably a hydrogen atom.

The compounds represented by formula (II) may contain other repeating unit than the repeating unit represented by formula (II-1A) or the repeating unit represented by formula (II-1B). As to the other repeating unit, the description of copolymerization component disclosed in paragraphs 0068 to 0075 of JP-A-2010-106268 (corresponding to paragraphs 0112 to 0118 of U.S. Patent Publication No. 2011/0124824) can be referred to, and the contents thereof are incorporated into the specification.

Preferred other repeating unit includes a repeating unit represented by formula (II-1C) shown below.

[Chem. 10]

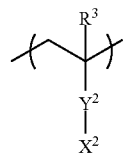

(II-1C)

In formula (II-1C), $R^3$ represents a hydrogen atom or a methyl group, and is preferably a hydrogen atom.

$Y^2$ represents a single bond or a divalent connecting group, and the divalent connecting group has the same meaning as the divalent connecting group represented by $Y^1$ described above. In particular, $Y^2$ is preferably —COO—, —CO—, —HN—, a straight-chain or branched alkylene group, a group formed by a combination of these groups, or a single bond.

In formula (II-1C), $X^2$ represents —PO$_3$H, —PO$_3$H$_2$, —OH or —COOH, and is preferably —COOH.

In the case where the compound represented by formula (II) contains other repeating unit (preferably the repeating unit represented by formula (II-1A) or formula (II-1B), a molar ratio of the repeating unit represented by formula (II-1A) or formula (II-1B) and the repeating unit represented by formula (II-1C) is preferably from 95:5 to 20:80, and more preferably from 90:10 to 40:60.

Specific examples of the first embodiment of the compound represented by formula (II) include the compounds set forth below and salts thereof, but the invention should not be construed as being limited thereto.

TABLE 1

B-1

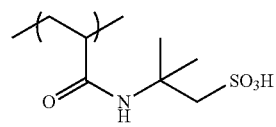

Mw = 100000

B-2

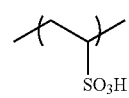

Mw = 20000

B-3

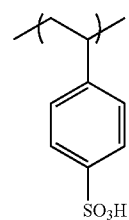

Mw = 50000

B-4

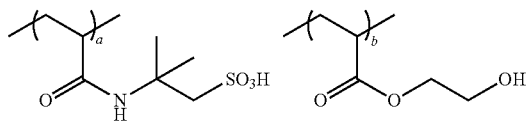

a/b = 80/20 mol % Mw = 40000

TABLE 1-continued
B-5 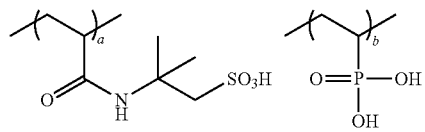
a/b = 90/10 mol % Mw = 45000
B-6 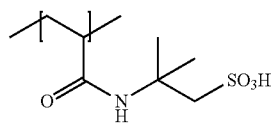
Mw = 5,000
B-7 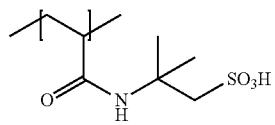
Mw = 20,000
B-8 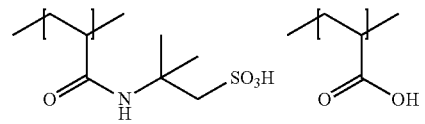
Mw = 100,000
B-9 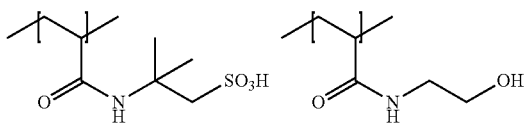
Mw = 30,000
B-10 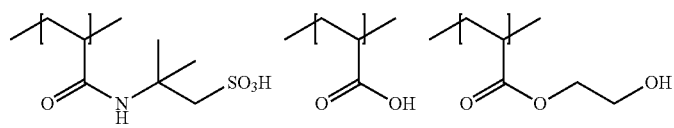
Mw = 30,000
B-11 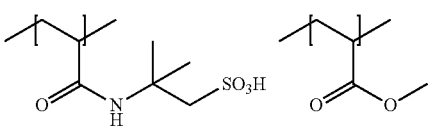
Mw = 30,000
B-12 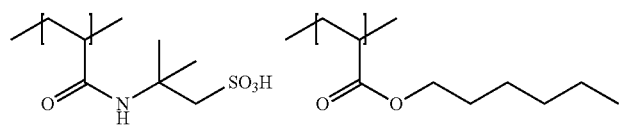
Mw = 30,000
B-13 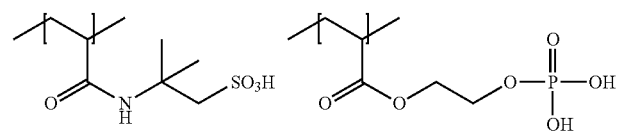
Mw = 30,000

TABLE 1-continued

B-14

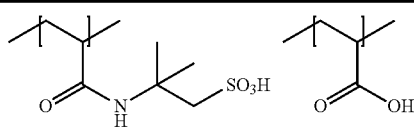

Mw = 20,000

B-15

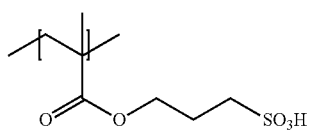

Mw = 20,000

Specific examples of the cyanine-based dye and the quaterrylene-based dye includes compounds described, for example, in JP-A-2012-215806 and JP-A-2008-9206.

Specific examples of the phthalocyanine compound include compounds described in JP-A-60-224589, JP-T-2005-537319, JP-A-4-23868, JP-A-4-39361, JP-A-5-78364, JP-A-5-222047, JP-A-5-222301, JP-A-5-222302, JP-A-5-345861, JP-A-6-25548, JP-A-6-107663, JP-A-6-192584, JP-A-6-228533, JP-A-7-118551, JP-A-7-118552, JP-A-8-120186, JP-A-8-225751, JP-A-9-202860, JP-A-10-120927, JP-A-10-182995, JP-A-11-35838, JP-A-2000-26748, JP-A-2000-63691, JP-A-2001-106689, JP-A-2004-18561, JP-A-2005-220060 and JP-A-2007-169343.

Specific examples of the azo dye, the anthraquinone dye (anthraquinone compound) and the squarylium-based dye (squarylium compound) includes compounds described, for example, in JP-A-2012-215806.

The dye is also available as a commercial product, and for example, LUMOGEN IR765 and LUMOGEN IR788 (produced by BASF), ABS643, ABS654, ABS667, ABS670T, IRA693N and IRA735 (produced by Exciton, Inc.), SDA3598, SDA6075, SDA8030, SDA8303, SDA8470, SDA3039, SDA3040, SDA3922 and SDA7257 (produced by H.W. Sands Corp.) and TAP-15 and IR-706 (produced by Yamada Chemical Co., Ltd.) are exemplified, and in particular, as the cyanine dye Daito Chmix 1371F (produced by Daito Chemix Corp.), and as phthalocyanine dye EXCOLOR Series, EXCOLOR TX-EX 720 and EXCOLOR TX-EX 708K (produced by Nippon Shokubai Co., Ltd.) and the like are exemplified, but the invention should not be construed as being limited thereto.

The dye is preferably a fine particle. The average particle size of the dye is preferably 800 nm or less, more preferably 400 nm or less, and still more preferably 200 nm or less. By setting the average particle size in the range described above, since the dye is less likely to block the visible light by light scattering, it is possible to more ensure a light transmitting property in the visible light region. From the standpoint of avoiding the light scattering, the smaller average particle size is preferred, but because of the ease of handling at the time of production and the like, the average particle size of the dye is ordinarily 1 nm or more.

The content of the dye is preferably from 0.05 to 90% by mass, more preferably from 0.5 to 80% by mass, based on the total solid content mass of the composition according to the invention.

However, in the case where the dye is the copper complex, the content of the copper complex is preferably 30% by mass or more, more preferably from 30 to 90% by mass, still more preferably from 40 to 90% by mass, particularly preferably from 50 to 90% by mass, based on the total solid content mass of the composition according to the invention.

In particular, it is one preferred embodiment of the invention that the composition according to the invention further contains a polymerizable compound and a solvent described later and the content of the dye in the total solid content of the composition is 30% by mass or more.

In the case where the dye has high $\in$ (epsilon), the content thereof may be small, but in the case where the dye has low $\in$ (epsilon), the content thereof becomes large. In the case where the dye is the cyanine-based dye, phthalocyanine-based dye or the like, the content of the dye is preferably from 0.01 to 20% by mass, more preferably from 0.5 to 10% by mass, based on the total solid content mass of the composition according to the invention.

Also, two or more kinds of the dyes may be used. For example, it is preferred to use the pyrrolopyrrole dye and the copper complex in combination from the standpoint of the heat resistance endurable the reflow process. In the case of using two or more kinds of dyes, the dyes may be incorporated into the same layer or may be incorporated into different layers.

[2] Polymerizable Compound

The curable resin composition according to the invention can be preferably constituted by containing at least one kind of polymerizable compounds.

As the polymerizable compound, a compound having two or more epoxy groups or oxetanyl groups in its molecule is preferably used.

(Compound Having Two or More Epoxy Groups (Oxiranyl Groups) or Oxetanyl Groups in its Molecule)

Specific examples of the compound having two or more epoxy groups in its molecule as the polymerizable compound include a bisphenol A type epoxy resin, a bisphenol F type epoxy resin, a phenol novolac type epoxy resin, a cresol novolac type epoxy resin, and an aliphatic epoxy resin.

These are available as commercial products. For instance, as the bisphenol A type epoxy resin, for example, JER-827, JER-828, JER-834, JER-1001, JER-1002, JER-1003, JER-1055, JER-1007, JER-1009 and JER-1010 (produced by Mitsubishi Chemical Corp.), and EPICLON 860, EPICLON 1050, EPICLON 1051 and EPICLON 1055 (produced by DIC Corp.) are exemplified, as the bisphenol F type epoxy resin, JER-806, JER-807, JER-4004, JER-4005, JER-4007, JER-4010 (produced by Mitsubishi Chemical Corp.), EPICLON 830 and EPICLON 835 (produced by DIC Corp.), and LCE-21 and RE-602S (produced by Nippon Kayaku Co., Ltd.) are exemplified, as the phenol novolak type epoxy resin, JER-152, JER-154, JER-157S70 and JER-157S65 (produced by Mitsubishi Chemical Corp.), and EPICLON N-740, EPICLON N-740, EPICLON N-770 and EPICLON N-775 (produced by DIC Corp.) are exemplified, as the cresol novolak epoxy resin, EPICLON N-660, EPICLON N-665, EPICLON N-670, EPICLON N-673, EPICLON N-680, EPICLON N-690 and EPICLON N-695 (produced by DIC Corp.), and EOCN-1020 (produced by Nippon Kayaku Co., Ltd.) are exemplified, and as the aliphatic epoxy resin, ADEKA RESIN EP-4080S, ADEKA RESIN EP-4085S and ADEKA RESIN EP-4088S (produced by ADEKA Corp.), CELLOXIDE 2021P, CELLOXIDE 2081, CELLOXIDE 2083, CELLOXIDE 2085, EHPE-3150, EPOLEAD PB 3600 and EPOLEAD PB 4700 (produced by Daicel Chemical Industries, Ltd.), and DENACOL EX-211L, EX-212L, EX-214L, EX-216L, EX-321L and EX-850L (produced by Nagase chemteX Corp.) are exemplified. In addition, ADEKA RESIN EP-4000S, ADEKA RESIN EP-4003S, ADEKA RESIN EP-4010S and ADEKA RESIN EP-4011S (produced by ADEKA Corp.), NC-2000, NC-3000, NC-7300, XD-1000, EPPN-501 and EPPN-502 (produced by ADEKA Corp.), JER-1031S (produced by Mitsubishi Chemical Corp.) and the like are exemplified.

The compounds may be used individually or in combination of two or more thereof.

Specific examples of the compound having two or more oxetanyl groups in its molecule include ARONOXETAN OXT-121, OXT-221, OX-SQ and PNOX (produced by Toagosei Co., Ltd.).

Also, the compound containing oxetanyl groups is preferably used individually or in combination with the compound containing epoxy groups.

The polymerizable compound is also preferably selected from compounds having at least one terminal ethylenically unsaturated bond, preferably two or more terminal ethylenically unsaturated bonds. The polymerizable compound may be used individually or in combination of two or more thereof in the invention. In particular, any of the compound having two or more epoxy groups or oxetanyl groups in its molecule and the compound having at least one terminal ethylenically unsaturated bond, preferably two or more terminal ethylenically unsaturated bonds may be used individually, or the compound having two or more epoxy groups or oxetanyl groups in its molecule and the compound having at least one terminal ethylenically unsaturated bond, preferably two or more terminal ethylenically unsaturated bonds may be used in combination.

As to the compound having at least one terminal ethylenically unsaturated bond, preferably two or more terminal ethylenically unsaturated bonds, specifically, examples of the monomer and prepolymer thereof include an unsaturated carboxylic acid (for example, acrylic acid, methacrylic acid, itaconic acid, crotonic acid, isocrotonic acid or maleic acid), its esters and its amides, and multimers thereof. Esters of an unsaturated carboxylic acid and an aliphatic polyhydric alcohol compound, amides of an unsaturated carboxylic acid and an aliphatic polyvalent amine compound, and multimers thereof are preferred.

Also, an addition reaction product of an unsaturated carboxylic acid ester or amide having a nucleophilic substituent, for example, a hydroxy group, an amino group or a mercapto group, with a monofunctional or polyfunctional isocyanate or epoxy compound, and a dehydration condensation reaction product of the unsaturated carboxylic acid ester or amide with a monofunctional or polyfunctional carboxylic acid may be also preferably used.

Also, an addition reaction product of an unsaturated carboxylic acid ester or amide having an electrophilic substituent, for example, an isocyanate group or an epoxy group, with a monofunctional or polyfunctional alcohol, amine or thiol, and a substitution reaction product of an unsaturated carboxylic acid ester or amide having a releasable substituent, for example, a halogen atom or a tosyloxy group, with a monofunctional or polyfunctional alcohol, amine or thiol are also preferable.

As other examples, compounds where the unsaturated carboxylic acid described above is replaced by an unsaturated phosphonic acid, a vinylbenzene derivative, for example, styrene, vinyl ether, allyl ether may also be used.

As to specific examples of the compound, compounds described in paragraphs 0095 to 0108 of JP-A-2009-288705 may also be preferably used in the invention.

As to the polymerizable compound, a compound having at least one addition-polymerizable ethylene group and having a boiling point of 100° C. or more under normal pressure is also preferred as a polymerizable monomer. Examples thereof include a monofunctional acrylate or methacrylate, for example, polyethylene glycol mono(meth)acrylate, polypropylene glycol mono(meth)acrylate or phenoxyethyl (meth)acrylate; a polyfunctional acrylate or methacrylate, for example, polyethylene glycol di(meth)acrylate, trimethylolethane tri(meth)acrylate, neopentyl glycol di(meth)acrylate, pentaerythritol tri(meth)acrylate, pentaerythritol tetra(meth)acrylate, dipentaerythritol penta(meth)acrylate, dipentaerythritol hexa(meth)acrylate, hexanediol (meth)acrylate, trimethylolpropane tri(acryloyloxypropyl)ether, tri(acryloyloxyethyl) isocyanurate, a compound obtained by adding ethylene oxide or propylene oxide to a polyfunctional alcohol, for example, glycerol or trimethylolethane, followed by (meth)acrylation, an urethane (meth)acrylate as described in JP-B-48-41708, JP-B-50-6034 and JP-A-51-37193, a polyester acrylate described in JP-A-48-64183, JP-B-49-43191 and JP-B-52-30490, and an epoxy acrylate as a reaction product of an epoxy resin and (meth)acrylic acid; and a mixture thereof.

A polyfunctional (meth)acrylate obtained by reacting a polyfunctional carboxylic acid with a compound having a cyclic ether group and an ethylenically unsaturated group, for example, glycidyl (meth)acrylate is also exemplified.

As other preferred polymerizable compounds, compounds having a fluorene ring and difunctional or more ethylenically unsaturated groups described in JP-A-2010-160418, JP-A-2010-129825 and Japanese Patent No. 4364216, and a cardo resin may be also used.

Also, as the compound having a boiling point of 100° C. or more under normal pressure and having at least one addition-polymerizable ethylenically unsaturated group, compounds described in paragraphs 0254 to 0257 of JP-A-2008-292970 are also preferable.

In addition, radical polymerizable monomers represented by formulae (MO-1) to (MO-5) described in paragraphs 0297 to 0300 of JP-A-2012-215806 may also preferably used.

As specific examples of the radical polymerizable monomers represented by formulae (MO-1) to (MO-5), compounds described in paragraphs 0248 to 0251 of JP-A-2007-269779 may also preferably used in the invention.

Compounds obtained by adding ethylene oxide or propylene oxide to the above-described polyfunctional alcohol and then (meth)acrylating the adduct, described as formulae (1) and (2) together with their specific examples in JP-A-10-62986 may also be used as the polymerizable compound.

Among them, as the polymerizable compound, dipentaerythritol triacrylate (as a commercial product, KAYARAD D-330 produced by Nippon Kayaku Co., Ltd.), dipentaerythritol tetraacrylate (as a commercial product, KAYARAD D-320 produced by Nippon Kayaku Co., Ltd.), dipentaerythritol penta(meth)acrylate (as a commercial product, KAYARAD D-310, produced by Nippon Kayaku Co., Ltd.), dipentaerythritol hexa(meth)acrylate (as a commercial product, KAYARAD DPHA, produced by Nippon Kayaku Co., Ltd.), and structures where the (meth)acryloyl group of the compounds described above are connected through an ethylene glycol or propylene glycol residue are preferred. Oligomer types of these compounds may also be used.

The polymerizable compound may be a polyfunctional compound having an acid group, for example, a carboxyl group, sulfonic acid group or phosphoric acid group. Therefore, an ethylenic compound having an unreacted carboxyl group as in the case of the mixture described above may be used as it is, but, if desired, a non-aromatic carboxylic anhydride may be reacted with a hydroxy group of the ethylenic compound to introduce an acid group. In this case, specific examples of the non-aromatic carboxylic anhydride include tetrahydrophthalic anhydride, an alkylated tetrahydrophthalic anhydride, hexahydrophthalic anhydride, an alkylated hexahydrophthalic anhydride, succinic anhydride and maleic anhydride.

In the invention, the acid group-containing monomer is preferably a polyfunctional monomer which is an ester of an aliphatic polyhydroxy compound and an unsaturated carboxylic acid and obtained by reacting a non-aromatic carboxylic anhydride with an unreacted hydroxyl group of the aliphatic polyhydroxy compound to introduce the acid group, and particularly preferably the ester described above wherein the aliphatic polyhydroxy compound is pentaerythritol and/or dipentaerythritol. Examples of the commercial product thereof include as a polybasic acid-modified acryl oligomer, M-305, M-510 and M-520 of ARONIX Series produced by Toagosei Co., Ltd.

One of the monomers may be used alone, but since it is difficult to use a single compound in view of production, two or more monomers may be used as a mixture. Also, as the monomer, a polyfunctional monomer having no acid group and an acid polyfunctional monomer having an acid group may be used in combination, if desired. The acid value of the polyfunctional monomer having an acid group is preferably from 0.1 to 40 mg-KOH/g, and particularly preferably from 5 to 30 mg-KOH/g. When the acid value of the polyfunctional monomer is too low, a development dissolution characteristic decreases, on the other hand, when it is too high, production and handling become difficult, a photopolymerization characteristic decreases, and a curing property, for example, surface smoothness of the pixel deteriorates. Therefore, in the case where two or more polyfunctional monomers having different acid groups are used in combination or where a polyfunctional monomer having no acid group is used in combination, it is essential to adjust the monomers such that the acid value as the total polyfunctional monomer falls within the range described above.

Also, as the polymerizable monomer, a polyfunctional monomer having a caprolactone structure described in described in paragraphs 0306 to 0313 of JP-A-2012-215806 may be used.

The polyfunctional monomer having a caprolactone structure is commercially available as KAYARAD DPCA Series from Nippon Kayaku Co., Ltd., and includes DPCA-20 (compound represented by formulae (1) to (3) described above, wherein m is 1, a number of the group represented by formula (2) is 2, and all of $R^1$ are hydrogen atoms), DPCA-30 (compound represented by formulae (1) to (3) described above, wherein m is 1, a number of the group represented by formula (2) is 3, and all of $R^1$ are hydrogen atoms), DPCA-60 (compound represented by formulae (1) to (3) described above, wherein m is 1, a number of the group represented by formula (2) is 6, and all of $R^1$ are hydrogen atoms) and DPCA-120 (compound represented by formulae (1) to (3) described above, wherein m is 2, a number of the group represented by formula (2) is 6, and all of $R^1$ are hydrogen atoms).

The polyfunctional monomers having a caprolactone structure may be used individually or as a mixture of two or more thereof in the invention.

Also, as the polymerizable compound according to the invention, compounds represented by formula (Z-4) or (Z-5) described in paragraphs 0314 to 0324 of JP-A-2012-215806 may be used.

Examples of commercial product of the polymerizable compounds represented by formulae (Z-4) and (Z-5) include SR-494, which is a tetrafunctional acrylate having four ethyleneoxy chains, produced by Sartomer Co., and DPCA-60, which is a hexafunctional acrylate having six pentyleneoxy chains and TPA-330, which is a trifunctional acrylate having three isobutyleneoxy chains, both produced by Nippon Kayaku Co., Ltd.

Furthermore, urethane acrylates as described in JP-B-48-41708, JP-A-51-37193, JP-B-2-32293 and JP-B-2-16765, and urethane compounds having an ethylene oxide skeleton described in JP-B-58-49860, JP-B-56-17654, JP-B-62-39417 and JP-B-62-39418 are also preferable as the polymerizable compound. In addition, by using as the polymerizable compound, an addition-polymerizable compound having an amino structure or a sulfide structure in the molecule thereof described in JP-A-63-277653, JP-A-63-260909 and JP-A-1-105238, a curable composition very excellent in photosensitive speed can be obtained.

Examples of commercial product of the polymerizable compound include urethane oligomers UAS-10 and UAB-140 (produced by Sanyo Kokusaku Pulp Co., Ltd.), UA-7200 (produced by Shin-Nakamura Chemical Co., Ltd.), DPHA-40H (produced by Nippon Kayaku Co., Ltd.), UA-306H, UA-306T, UA-306I, AH-600, T-600 and AI-600 (produced by Kyoeisha Chemical Co., Ltd.).

As the polymerizable compound, a polyfunctional thiol compound having two or more mercapto (SH) groups in its molecule described in paragraphs 0216 to 0220 of JP-A-2012-150468 may also be used.

As to the polymerizable compound, details of the method of using thereof, for example, the structure thereof, individual or combination use or the amount thereof added can be appropriately determined in accordance with the final characteristic design of the curable resin composition. For example, from the standpoint of the sensitivity, a structure having a large unsaturated group content per molecular is preferred, and in many cases, a difunctional or higher functional structure is preferred. From the standpoint of increasing the strength of infrared ray cut filter, a trifunctional or higher functional compound is preferred. Further, a method of using compounds having different numbers of functional groups or different polymerizable groups (for example, an acrylate, a methacrylate, a styrene-based compound or a vinyl ether-based compound) in combination to control both the sensitivity and the strength is also effective. Moreover, the selection and use method of the polymerizable compound are also important factors for the compatibility and dispersibility with other components (for example, a dye, a photopolymerization initiator or a binder) contained in the curable resin composition. For example, the compatibility can be sometimes improved by using a low-purity compound or using two or more kinds of compounds in combination. Also, a specific structure may be selected for the purpose of improving the adhesion property to a hard surface of a support or the like.

The content of the polymerizable compound in the curable resin composition according to the invention is preferably from 0.1 to 90% by mass, more preferably from 1.0 to 80% by mass, particularly preferably from 2.0 to 70% by mass, based on the solid content of the curable resin composition.

[3] Polymerization Initiator

The curable resin composition according to the invention may contain a polymerization initiator. The polymerization initiator is not particularly limited so long as it has a function of initiating polymerization of the polymerizable compound by either light or heat or both of them, and it can be appropriately selected according to the purpose, but it is preferably a photopolymerizable compound. In the case of initiating the polymerization by light, a compound having photosensitivity to light from an ultraviolet region to a visible region is preferred.

In the case of initiating the polymerization by heat, an initiator capable of being decomposed from 150 to 250° C. is preferred.

The polymerization initiator which can be used in the invention is preferably a compound having at least an aromatic group, and includes, for example, an acyl phosphine compound, an acetophenone-based compound, an α-aminoketone compound, a benzophenone-based compound, a benzoin ether-based compound, a ketal derivative compound, a thioxanthone compound, an oxime compound, a hexaarylbiimidazole compound, a trihalomethyl compound, an azo compound, an organic peroxide, a diazonium compound, an iodonium compound, a sulfonium compound, an azinium compound, a benzoin ether-based compound, a ketal derivative compound, an onium salt compound, for example, a metallocene compound, an organic boron salt compound and a disulfone compound.

From the standpoint of the sensitivity, an oxime compound, an acetophenone-based compound, an α-aminoketone compound, a trihalomethyl compound, a hexaarylbiimidazole compound and a thiol compound are preferred.

Examples of the polymerization initiator preferable in the invention are set forth below, but the invention should not be construed as being limited thereto.

The acetophenone-based compound specifically includes, for example, 2,2-diethoxyacetophenone, p-dimethylaminoacetophenone, 2-hydroxy-2-methyl-1-phenylpropan-1-one, p-dimethylaminoacetophenone, 4'-isopropyl-2-hydroxy-2-methylpropiophenone, 1-hydroxycyclohexyl phenyl ketone, 2-benzyl-2-dimethylamino-1-(4-morpholinophenyl)butanone-1,2-tolyl-2-dimethylamino-1-(4-morpholinophenyl)butanone-1,2-methyl-1-[4-(methylthio)phenyl]-2-morpholinopropanone-1,2-methyl-1-(4-methylthiophenyl)-2-morpholinopropan-1-one, 2-benzyl-2-dimethylamino-1-(4-morpholinophenyl)butanone-1,2-(dimethylamino)-2-[(4-methylphenyl)methyl]-1-[4-(4-morpholinyl)phenyl]-1-butanone and 2-methyl-1-(4-methylthiophenyl)-2-morpholinopropan-1-one.

As the trihalomethyl compound, a s-triazine derivative having at least one of mono-, di- or tri-halogen substituted methyl group connected to the s-triazine ring is more preferable, and specifically includes, for example, 2,4,6-tris(monochloromethyl)-s-triazine, 2,4,6-tris(dichloromethyl)-s-triazine, 2,4,6-tris(trichloromethyl)-s-triazine, 2-methyl-4,6-bis(trichloromethyl)-s-triazine, 2-n-propyl-4,6-bis(trichloromethyl)-s-triazine, 2-(α,α,β-trichloroethyl)-4,6-bis(trichloromethyl)-s-triazine, 2-phenyl-4,6-bis(trichloromethyl)-s-triazine, 2-(p-methoxyphenyl)-4,6-bis(trichloromethyl)-s-triazine, 2-(3,4-epoxyphenyl)-4,6-bis(trichloromethyl)-s-triazine, 2-(p-chlorophenyl)-4,6-bis(trichloromethyl)-s-triazine, 2-[1-(p-methoxyphenyl)-2,4-butadienyl]-4,6-bis(trichloromethyl)-s-triazine, 2-styryl-4,6-bis(trichloromethyl)-s-triazine, 2-(p-methoxystyryl)-4,6-bis(trichloromethyl)-s-triazine, 2-(p-isopropyloxystyryl)-4,6-bis(trichloromethyl)-s-triazine, 2-(p-tolyl)-4,6-bis(trichloromethyl)-s-triazine, 2-(4-naphthoxynaphthyl)-4,6-bis(trichloromethyl)-s-triazine, 2-phenylthio-4,6-bis(trichloromethyl)-s-triazine, 2-benzylthio-4,6-bis(trichloromethyl)-s-triazine, 2,4,6-tris(dibromomethyl)-s-triazine, 2,4,6-tris(tribromomethyl)-s-triazine, 2-methyl-4,6-bis(tribromomethyl)-s-triazine and 2-methoxy-4,6-bis(tribromomethyl)-s-triazine.

The hexaarylbiimidazole compound includes various compounds described, for example, in JP-B-6-29285 and U.S. Pat. Nos. 3,479,185, 4,311,783 and 4,622,286 and specifically, for example, 2,2'-bis(o-chlorophenyl)-4,4',5,5'-tetraphenylbiimidazole, 2,2'-bis(o-bromophenyl)-4,4',5,5'-tetraphenylbiimidazole, 2,2'-bis(o,p-dichlorophenyl)-4,4',5,5'-tetraphenylbiimidazole, 2,2'-bis(o-chlorophenyl)-4,4',5,5'-tetra(m-methoxyphenyl)biimidazole, 2,2'-bis(o,o'-dichlorophenyl)-4,4',5,5'-tetraphenylbiimidazole, 2,2'-bis(o-nitrophenyl)-4,4',5,5'-tetraphenylbiimidazole, 2,2'-bis(o-methylphenyl)-4,4',5,5'-tetraphenylbiimidazole and 2,2'-bis(o-trifluorophenyl)-4,4',5,5'-tetraphenylbiimidazole.

The oxime compound includes, for example, compounds described in J. C. S. Perkin II (1979) 1653-1660, J. C. S. Perkin II (1979) 156-162, Journal of Photopolymer Science and Technology (1995) 202-232 and JP-A-2000-66385, compounds described in JP-A-2000-80068 and JP-T-2004-534797, and IRGACURE OXE 01 (1,2-octanedione, 1-[4-(phenylthio)-, 2-(O-benzoyl oxime)]), IRGACURE OXE 02 (ethanone, 1-[9-ethyl-6-(2-methylbenzoyl)-9H-carbazol-3-yl]-, 1-(O-acetyloxime)) and 2-(acetyloxyiminomethyl)thioxanthen-9-one (produced by BASF Japan Ltd.).

Further, cyclic oxime compounds described in JP-A-2007-231000 and JP-2007-322744 are also preferably used.

Most preferably, an oxime compound having a specific substituent described in JP-A-2007-269779 or an oxime compound having a thioaryl group described in JP-2009-191061 is exemplified.

The photopolymerization initiator is more preferably a compound selected from the group consisting of an oxime compound, an acetophenone-based compound and an acyl phosphine compound. More specifically, for example, aminoacetophenone-based initiators described in JP-A-10-291969, acyl phosphine oxide-based initiators described in Japanese Patent No. 4225898, the oxime-based initiators described above, and as an oxime-based initiator, compounds described in JP-A-2001-233842 can be used.

As the acetophenone-based initiator, commercial products, that is, IRGACURE-907, IRGACURE-369 and IRGACURE-379 (trade names, produced by BASF Japan Ltd.) can be used. As the acyl phosphine-based initiator, commercial products, that is, IRGACURE-819 or DAROCUR-TPO (trade names, produced by BASF Japan Ltd.) can be used.

The polymerization initiator may be used individually or may be used in combination of two or more thereof.

The content of polymerization initiator is preferably from 0.01 to 30% by mass, more preferably from 0.1 to 20% by mass, particularly preferably from 0.1 to 15% by mass, with respect to the total solid content mass of the polymerizable composition according to the invention.

[4] Binder

The curable resin composition according to the invention may contain a binder.

The binder is not particularly limited, and it may be an alkali-soluble resin.

The alkali-soluble resin can be appropriately selected from alkali-soluble resins each of which is a liner organic high molecular polymer and contains at least one group accelerating alkali-solubility in its molecule (preferably, molecule in which a main chain is an acrylic copolymer or a styrene copolymer). From the standpoint of heat resistance, a polyhydroxystyrene-based resin, a polysiloxane-based resin, an acrylic resin, an acrylamide-based resin and an acrylic/acrylamide copolymer resin are preferred, and from the standpoint of controlling development property, an acrylic resin, an acrylamide-based resin and an acrylic/acrylamide copolymer resin are preferred.

As the alkali-soluble resin, in particular, a benzyl (meth)acrylate/(meth)acrylic acid copolymer and a multicomponent copolymer composed of benzyl (meth)acrylate/(meth)acrylic acid/other monomer are preferred. In addition, a copolymer of 2-hydroxyethyl methacrylate, and a 2-hydroxypropyl (meth)acrylate/polystyrene macromonomer/benzyl methacrylate/methacrylic acid copolymer, a 2-hydroxy-3-phenoxypropyl acrylate/polymethyl methacrylate macromonomer/benzyl methacrylate/methacrylic acid copolymer, a 2-hydroxyethyl methacrylate/polystyrene macromonomer/methyl methacrylate/methacrylic acid copolymer and a 2-hydroxyethyl methacrylate/polystyrene macromonomer/benzyl methacrylate/methacrylic acid copolymer described in JP-A-7-140654 and the like are exemplified. As a commercial product, for example, ACRYLBASE FF-187 and FF-426 (produced by Fujikura Kasei Co., Ltd.) are exemplified.

The content of the binder in the curable resin composition is preferably from 1 to 20% by mass, more preferably from 2 to 15% by mass, particularly preferably from 3 to 12% by mass, based on the total solid content of the composition.

[5] Filler

The curable resin composition according to the invention may further contain a filler. The filler which can be used in the invention includes a spherical silica surface-treated with a silane coupling agent.

The polymerizable composition containing a filler according to the invention is preferred in view of obtaining an infrared ray cut filter having high durability.

The "spherical" as to the spherical filler is sufficient if the particle is not in an acicular, columnar or amorphous shape but is rounded, and the particle need not be necessarily "perfectly spherical", but a typical "spherical" shape is a "perfectly spherical" shape.

Whether the filler is spherical can be confirmed by observation through a scanning electron microscope (SEM).

The volume average particle size of the primary particle of the filler is not particularly limited and may be appropriately selected according to the purpose, and is preferably from 0.05 to 3 μm, and more preferably from 0.1 to 1 μm. When the volume average particle size of the primary particle of the filler is in the range described above, reduction in the processability due to development of thixotropic property is suppressed and increase in the maximum particle size is prevented, which is advantageous in that the generation of defect caused by attachment of a foreign material to the infrared ray cut filter formed or unevenness of the coated layer is prevented.

The volume average particle size of the primary particle of the filler can be measured by a dynamic light scattering particle size distribution measuring device.

The filler can be dispersed by using the dispersing agent or binder described above. As described above, the alkali-soluble binder polymer having a crosslinkable group in the side chain is particularly preferred from the standpoint of curability.

—Surface Treatment—

The surface treatment of the filler is described below. The surface treatment of the filler is not particularly limited and may be appropriately selected according to the purpose, and a treatment of covering silica with a silane coupling agent is preferred.

—Silane Coupling Agent—

The silane coupling agent used for the surface treatment of the filler is not particularly limited and may be appropriately selected according to the purpose, and it preferably has at least one functional group selected from an alkoxysilyl group, a chlorosilyl group and an acetoxysilyl group (hereinafter, also referred to as a "first functional group") and at least one functional group selected from a (meth)acryloyl group, an amino group and an epoxy group (hereinafter, also referred to as a "second functional group"). The second functional group is more preferably a (meth)acryloyl group or an amino group, and still more preferably a (meth)acryloyl group. It is advantageous from the standpoint of preservation stability that the second functional group is a (meth)acryloyl group.

Silane coupling agents containing as the first functional group, at least one group selected from an alkoxysilyl group, a chlorosilyl group and an acetoxysilyl group, and as the second functional group, at least one group selected from an imidazole group, an alkylimidazole group and a vinyl imidazole group described in JP-B-7-68256 can also be preferably used.

The silane coupling agent is not particularly limited and preferable examples thereof include γ-aminopropyltriethoxysilane, N-(β-aminoethyl)-γ-aminopropyltrimethoxysilane, N-(β-aminoethyl)-γ-aminopropylmethyldimethoxysilane, γ-glycidoxypropyltrimethoxysilane, γ-glycidoxypropylmethyldimethoxysilane, γ-methacryloxypropyltrimethoxysilane, γ-methacryloxypropylmethyldimethoxysilane, and α[[3-(trimethoxysilyl)propoxy]methyl]imidazole-1-ethanol, 2-ethyl-4-methyl-a-[[3-(trimethoxysilyl)propoxy]methyl] imidazole-1-ethanol, 4-vinyl-a-[[3-(trimethoxysilyl) propoxy]methyl]imidazole-1-ethanol, 2-ethyl-4-methylimidazopropyltrimethoxysilane and salts, intramolecular condensates and intermolecular condensates thereof described in JP-B-7-68256. The silane coupling agents may be used individually or in combination of two or more thereof.

The surface treatment of the spherical silica with the silane coupling agent may be previously performed only for the spherical silica (in this case, hereinafter, the treatment is also referred to as a "pretreatment") or may be performed together with a part or all of other fillers contained in the curable resin composition.

The method for performing the pretreatment is not particularly limited and examples thereof include a dry method, an aqueous solution method, an organic solvent method and a spraying method. The temperature for performing the pretreatment is not particularly limited and is preferably from ordinary temperature to 200° C.

At the pretreatment, it is also preferred to add a catalyst. The catalyst is not particularly limited and examples thereof include an acid, a base, a metal compound and an organic metal compound.

The amount of the silane coupling agent added when performing the pretreatment is not particularly limited and is preferably from 0.01 to 50 parts by mass, more preferably from 0.05 to 50 parts by mass, per 100 parts by mass of the spherical silica. When the amount added is in the range described above, the surface treatment sufficient for exhibiting the effect is performed and reduction in the handling property resulting from aggregation of the spherical silica after the treatment is suppressed.

The silane coupling agent has an action of increasing the adhesion property between the substrate and the infrared ray cut filter, because the first functional group reacts with an active group on the substrate surface, on the spherical silica surface or in the binder, and further the second functional group reacts with a carboxyl group or an ethylenically unsaturated group in the binder. On the other hand, the silane coupling agent has high reactivity and therefore, when the silane coupling agent itself is added to the polymerizable composition, due to its diffusing action, mainly the second functional group is reacted or deactivated during preservation to cause a decrease in shelf life or pot life in some cases.

However, when the spherical silica which is pretreated with a silane coupling agent as described above is used, since the diffusing action is suppressed, the problem in the shelf life or pot life is greatly improved and it is possible to make a one-component type composition. Moreover, in the case of applying the pretreatment to the spherical silica, since the conditions, for example, stirring condition, temperature condition or use of a catalyst can be freely selected, the reaction rate between the first functional group of the silane coupling agent and the active group of the spherical silica can be significantly increased in comparison with the case of adding the spherical silica without performing the pretreatment. Therefore, very good results can be obtained particularly in severe characteristics required, for example, electroless gold plating, electroless solder plating and humidity resistance load test. Also, by performing the pretreatment, the amount of the silane coupling agent used can be reduced and the shelf life and pot life can be more improved.

Examples of the spherical silica surface-treated with a silane coupling agent which can be used in the invention include FB and SFP Series of Denki Kagaku Kogyo Kabushiki Kaisha, 1-FX of Tatsumori Ltd., HSP Series of Toagosei Co., Ltd., and SP Series of Fuso Chemical Co., Ltd.

The curable resin composition may or may not contain the filler, and in the case where the curable resin composition contains the filler, although the content of the filler is not particularly limited and may be appropriately selected according to the purpose, it is preferably from 1 to 60% by mass based on the total solid content mass of the curable resin composition. When the content is in the range described above, a sufficient reduction in the linear expansion coefficient is achieved and the infrared ray cut filter formed is prevented from embrittlement and thus, its function as the infrared ray cut filter is sufficiently exerted.

[6] Dispersing Agent

In the curable resin composition according to the invention, the dye and the filler may be dispersed to use by employing a known dispersing agent for the purpose of enhancing dispersibility and dispersion stability thereof.

The dispersing agent which can be used in the invention includes a polymer dispersing agent (for example, polyamidoamine and salt thereof, polycarboxylic acid and salt thereof, a high molecular weight unsaturated acid ester, a modified polyurethane, a modified polyester, a modified poly(meth)acrylate, a (meth)acrylic copolymer or a naphthalenesulfonic acid-formalin condensate), and a surfactant, for example, a polyoxyethylene alkyl phosphate ester, a polyoxyethylene alkylamine or an alkanolamine.

The polymer dispersing agent can be further classified into a straight-chain polymer, a terminal-modified polymer, a graft polymer and a block polymer according to the structure thereof.

Examples of the terminal-modified polymer having an anchor moiety to the surface include polymers having a phosphoric acid group at the terminal described, for example, in JP-A-3-112992 and JP-T-2003-533455, polymers having a sulfonic acid group at the terminal described, for example, in JP-A-2002-273191, polymers having an organic dye partial structure or a heterocyclic ring described, for example, in JP-A-9-77994, and polymers produced by modifying an oligomer or polymer having a hydroxy group or an amino group at one terminal with an acid anhydride described, for example, in JP-A-2008-29901. A polymer in which two or more anchor moieties (for example, an acid group, a basic group, an organic dye partial structure or a heterocyclic ring) to the surface of infrared ray shielding material are introduced into the polymer terminal described in JP-A-2007-277514 is also preferred because of its excellent dispersion stability.

Examples of the graft polymer having an anchor moiety to the surface include reaction products of a poly(lower alkylene imine) and a polyester described, for example, in JP-A-54-37082, JP-T-8-507960 and JP-A-2009-258668, reaction products of a polyallylamine and a polyester described, for example, in JP-A-9-169821, amphoteric dispersing resins having a basic group and an acidic group described in JP-A-2009-203462, copolymers of a macromonomer and a nitrogen atom-containing monomer described, for example, in JP-A-10-339949 and JP-A-2004-37986, graft polymers having an organic dye partial structure or a heterocyclic ring described, for example, in JP-A-2003-238837, JP-A-2008-9426 and JP-A-2008-81732, and copolymers of a macromonomer and an acid group-containing monomer described, for example, in JP-A-2010-106268.

As to the macromonomer used when producing a graft polymer having an anchor moiety to the surface by radical polymerization, a known macromonomer may be used and examples thereof include MACROMONOMER AA-6 (polymethyl methacrylate having a terminal group of a methacryloyl group), AS-6 (polystyrene having a terminal group of a methacryloyl group), AN-6S (copolymer of an acrylonitrile and a styrene having a terminal group of a methacryloyl group) and AB-6 (polybutyl acrylate having a terminal group of a methacryloyl group) produced by Toagosei Co., Ltd.; PLACCEL FM5 (5 molar equivalent adduct of ε-caprolactone to 2-hydroxyethyl methacrylate) and FA10L (10 molar equivalent adduct of ε-caprolactone to 2-hydroxyethyl acrylate) produced by Daicel Chemical Industries, Ltd.; and a polyester-based macromonomer described in JP-A-2-272009. Among them, a polyester-based macromonomer excellent in flexibility and solvent affinity is particularly preferred from the standpoint of dispersibility and dispersion stability of the infrared ray shielding material in the composition, and a polyester-based macromonomer represented by the polyester-based macromonomer described in JP-A-2-272009 is most preferred.

As to the block polymer having an anchor moiety to the surface, block polymers described, for example, in JP-A-2003-49110 and JP-A-2009-52010 are preferred.

The dispersing agent which can be used may be appropriately selected, for example, from known dispersing agents and surfactants.

Specific examples thereof include DISPERBYK 101 (polyamidoamine phosphate), 107 (carboxylic acid ester), 110 (copolymer containing an acid group), 130 (polyamide), 161, 162, 163, 164, 165, 166, 170 (high molecular weight copolymer) and BYK-P104, P105 (high molecular weight unsaturated polycarboxylic acid) produced by BYK Chemie GmbH; EFKA 4047, 4050-4010-4165 (polyurethane-based), EFKA 4330-4340 (block copolymer), 4400-4402 (modified polyacrylate), 5010 (polyester amide), 5765 (high molecular weight polycarboxylate), 6220 (fatty acid polyester) and 6745 (phthalocyanine derivative) produced by EFKA; AJISPER PB821, PB822, PB880 and PB881 produced by Ajinomoto Fine Techno Co., Inc.; FLOWLEN TG-710 (urethane oligomer) and POLYFLOW No. 50E and No. 300 (acrylic copolymer) produced by Kyoeisha Chemical Co., Ltd.; DISPERON KS-860, 873SN, 874, #2150 (aliphatic polyvalent carboxylic acid), #7004 (polyetherester), DA-703-50, DA-705 and DA-725 produced by Kusumoto Chemicals Ltd.; DEMOL RN, N (naphthalenesulfonic acid-formalin polycondensate), MS, C, SN-B (aromatic sulfonic acid-formalin polycondensate), HOMOGENOL L-18 (high molecular weight polycarboxylic acid), EMULGEN 920, 930, 935, 985 (polyoxyethylene nonylphenyl ether) and ACETAMIN 86 (stearylamine acetate) produced by Kao Corp.; SOLSPERSE 5000 (phthalocyanine derivative), 13240 (polyester amine), 3000, 17000, 27000 (polymer having a functional moiety at terminal), 24000, 28000, 32000 and 38500 (graft polymer) produce by Lubrizol Japan Ltd.; NIKKOL T106 (polyoxyethylene sorbitan monooleate), MYS-IEX (polyoxyethylene monostearate) produced by Nikko Chemicals Co., Ltd.; HINOACT T-8000E, produced by Kawaken Fine Chemicals Co., Ltd.; Organosiloxane Polymer KP341, produced by Shin-Etsu Chemical Co., Ltd.; cationic surfactant W001, a nonionic surfactant, for example, polyoxyethylene lauryl ether, polyoxyethylene stearyl ether, polyoxyethylene oleyl ether, polyoxyethylene octylphenyl ether, polyoxyethylene nonylphenyl ether, polyethylene glycol dilaurate, polyethylene glycol distearate or sorbitan fatty acid ester and an anionic surfactant, for example, W004, W005 or W017 produced by Yusho Co., Ltd.); EFKA-46, EFKA-47, EFKA-47EA, EFKA Polymer 100, EFKA Polymer 400, EFKA Polymer 401 and EFKA Polymer 450 produced by Morishita & Co., Ltd.; a polymer dispersing agent, for example, DISPERSE AID 6, DISPERSE AID 8, DISPERSE AID 15 and DISPERSE AID 9100 produced by San Nopco Ltd.; ADEKA PLURONIC L31, F38, L42, L44, L61, L64, F68, L72, P95, F77, P84, F87, P94, L101, P103, F108, L121 and P-123 produced by ADEKA Corp.; and IONET (trade name) S-20 produced by Sanyo Chemical Industries, Co., Ltd.

The dispersing agents may be used individually or in combination of two or more thereof. As to the dispersing agent according to the invention, the terminal-modified polymer, graft polymer or block polymer having an anchor moiety to the surface of the infrared ray shielding material may also be used in combination with an alkali-soluble resin. Examples of the alkali-soluble resin include a (meth) acrylic acid copolymer, an itaconic acid copolymer, a crotonic acid copolymer, a maleic acid copolymer, a partially esterified maleic acid copolymer, an acidic cellulose derivative having a carboxylic acid in its side chain and a resin obtained by modifying a hydroxy group-containing polymer with an acid anhydride, and particularly a (meth)acrylic acid copolymer is preferred. Also, N-position substituted maleimide monomer copolymers described in JP-A-10-300922, ether dimer copolymers described in JP-A-2004-300204 and polymerizable group-containing alkali-soluble resins described in JP-A-7-319161 are preferred.

From the standpoint of dispersibility and sedimentation property, resins described in JP-A-2010-106268 are preferred. In particular, from the standpoint of dispersibility, a polymer dispersing agent having a polyester chain in its side chain is preferred, and a resin having an acid group and a polyester chain is also preferably exemplified. As to the acid group in the dispersing agent, in view of adsorptivity, an acid group having a pKa of 6 or less is preferred, and particularly a carboxylic acid, a sulfonic acid or a phosphoric acid is preferred.

Specific examples of the resin include specific examples described in paragraphs 0078 to 0111 of JP-A-2010-106268.

In the case where the curable resin composition according to the invention contains the polymerizable compound and the dispersing agent, it is preferred to prepare first a dispersion composition containing the dye and the dispersing agent by using an appropriate solvent and then to blend the polymerizable composition with the dispersion composition from the standpoint of enhancing the dispersibility.

The curable resin composition may or may not contain the dispersing agent, and in the case where curable resin composition contains the dispersing agent, the content of the dispersing agent in the composition is preferably from 1 to 90% by mass, more preferably from 3 to 70% by mass, based on the mass of the dye contained in the composition.

[7] Sensitizer

The curable resin composition according to the invention may contain a sensitizer for the purpose of increasing the radical generating efficiency of the polymerization initiator and making the photosensitive wavelength longer. The sensitizer which can be used in the invention is preferably a compound capable of sensitizing the photopolymerization initiator described above by an electron transfer mechanism or an energy transfer mechanism. The sensitizer which can be used in the invention includes compounds belonging to compound groups described below and having an absorption wavelength in the wavelength region from 300 to 450 nm.

Preferred examples of the sensitizer include compounds belonging to the following compound groups and having an absorption wavelength in the wavelength region from 330 to 450 nm.

For instance, preferred compounds include a multinuclear aromatic compound (for example, phenanthrene, anthracene, pyrene, perylene, triphenylene or 9,10-dialkoxyanthracene), a xanthene (for example, fluorescein, eosin, erythrosine, Rhodamine B or rose Bengal), a thioxanthone (2,4-diethylthioxanthone, isopropylthioxanthone, diethylthioxanthone or chlorothioxanthone), a cyanine (for example, thiacarbocyanine or oxacarbocyanine), a merocyanine (for example, merocyanine or carbomerocyanine), a phthalocyanine, a thiazine (for example, thionine, methylene blue or toluidine blue), an acridine (for example, acridine orange, chloroflavin or acriflavin), an anthraquinone (for example, anthraquinone), a squarylium (for example, squarylium), acridine orange, a coumarin (for example, 7-diethylamino-4-methylcoumarin), a ketocoumarin, a phenothiazine, a phenazine, a styrylbenzene, an azo compound, diphenylmethane, triphenylmethane, a distyrylbenzene, a carbazole, porphyrin, a spiro compound, quinacridone, indigo, styryl, a pyrylium compound, a pyrromethene compound, a pyrazolotriazole compound, a benzothiazole compound, a barbituric acid derivative, a thiobarbituric acid derivative, acetophenone, benzophenone, a thioxanthone, an aromatic ketone compound, for example, Michler's ketone, and a heterocyclic compound, for example, N-aryloxazolidinone.

Other examples include compounds described in European Patent 568,993, U.S. Pat. Nos. 4,508,811 and 5,227,227, JP-A-2001-125255 and JP-A-11-271969.

The curable resin composition according to the invention may or may not contain the sensitizer, and in the case where the curable resin composition contains the sensitizer, the content of the sensitizer is preferably from 0.01 to 10% by mass, more preferably from 0.1 to 2% by mass, based on the total solid content mass of the curable resin composition.

[8] Crosslinking Agent

The curable resin composition according to the invention may further contain a crosslinking agent for the purpose of increasing the strength of the dye-containing layer.

As to the crosslinking agent, a compound having a crosslinkable group is preferred, and a compound having two or more crosslinkable groups is more preferred. Specific examples of the crosslinkable group preferably include an oxetane group and a cyanate group. Among them, an epoxy group, an oxetane group and a cyanate group are preferred. Specifically, the crosslinking agent is particularly preferably an epoxy compound, an oxetane compound or a cyanate compound.

Examples of the epoxy compound which can be preferably used as the crosslinkable agent in the invention include an epoxy compound containing at least two oxirane groups per molecule and an epoxy compound containing at least two epoxy groups having an alkyl group at the β-position per molecule.

Examples of the epoxy compound having at least two oxirane groups per molecule include a bixylenol type or biphenol type epoxy compound (for example, YX4000 produced by Japan Epoxy Resin Co., Ltd.) or a mixture thereof, a heterocyclic epoxy compound having an isocyanurate skeleton or the like (for example, TEPIC produced by Nissan Chemical Industries, Ltd. and ARALDITE PT810 produced by BASF Japan Ltd.), a bisphenol A type epoxy compound, a novolac type epoxy compound, a bisphenol F type epoxy compound, a hydrogenated bisphenol A type epoxy compound, a bisphenol S type epoxy compound, a phenol novolac type epoxy compound, a cresol novolac type epoxy compound, a halogenated epoxy compound (for example, low-brominated epoxy compound, high-halogenated epoxy compound or brominated phenol novolac type epoxy compound), an allyl group-containing bisphenol A type epoxy compound, a trisphenolmethane type epoxy compound, a diphenyldimethanol type epoxy compound, a phenol biphenylene type epoxy compound, a dicyclopentadiene type epoxy compound (for example, HP-7200 and HP-7200H produced by DIC Corp.), a glycidylamine type epoxy compound (for example, diaminodiphenylmethane type epoxy compound, glycidylaniline or triglycidylaminophenol), a glycidylester type epoxy compound (for example, diglycidyl phthalate, diglycidyl adipate, diglycidyl hexahydrophthalate or diglycidyl dimerate), a hydantoin type epoxy compound, an alicyclic epoxy compound (for example, 3,4-epoxycyclohexylmethyl-3',4'-epoxycyclohexane carboxylate, bis(3,4-epoxycyclohexylmethyl)adipate, dicyclopentadiene diepoxide or GT-300, GT-400 and ZEHPE 3150 produced by Daicel Chemical Industries, Ltd.), an imide type alicyclic epoxy compound, a trihydroxyphenylmethane type epoxy compound, a bisphenol A novolac type epoxy compound, a tetraphenylolethane type epoxy compound, a glycidyl phthalate compound, a tetraglycidyl xylenoylethane compound, a naphthalene group-containing epoxy compound (for example, naphthol aralkyl type epoxy compound, naphthol novolac type epoxy compound or tetrafunctional naphthalene type epoxy compound and as a commercial product, ESN-190 and ESN-360 produced by Nippon Steel Chemical Co., Ltd. or HP-4032, EXA-4750 and EXA-4700 produced by DIC Corp.), a reaction product of epichlorohydrin and a polyphenol compound which is obtained by an addition reaction between a phenol compound and a diolefin compound, for example, divinylbenzene and dicyclopentadiene, an epoxidation product of a ring-opening polymerization product of 4-vinylcyclohexene-1-oxide compound with peracetic acid or the like, an epoxy compound having a linear phosphorus-containing structure, an epoxy compound having a cyclic phosphorus-containing structure, an α-methylstilbene type liquid crystal epoxy compound, a dibenzoyloxybenzene type liquid crystal epoxy compound, an azophenyl type liquid crystal epoxy compound, an azomethine phenyl type liquid crystal epoxy compound, a binaphthyl type liquid crystal epoxy compound, an azine type epoxy compound, a glycidyl methacrylate copolymer-based epoxy compound (for example, CP-50S and CP-50M produced by NOF Corp.), a copolymer epoxy compound of cyclohexylmaleimide and glycidyl methacrylate, a bis(glycidyloxyphenyl)fluorene type epoxy compound and a bis(glycidyloxyphenyl)adamantane type epoxy compound, but the invention should not be construed as being limited thereto. The epoxy resins may be used individually or in combination of two or more thereof.

Further, other than the epoxy compound containing at least two oxirane groups per molecule, an epoxy compound containing at least two epoxy groups having an alkyl group at the β-position per molecule can be used. A compound containing an epoxy group substituted with an alkyl group at the β-position (more specifically, a β-alkyl-substituted glycidyl group or the like) is particularly preferred.

In the epoxy compounds containing at least an epoxy group having an alkyl group at the β-position, all of two or more epoxy groups contained per molecule may be β-alkyl-substituted glycidyl groups or at least one epoxy group may be a β-alkyl-substituted glycidyl group.

Examples of the oxetane compound include an oxetane resin having at least two oxetanyl groups per molecule.

Specific examples thereof include a polyfunctional oxetane, for example, bis[(3-methyl-3-oxetanylmethoxy)methyl]ether, bis[(3-ethyl-3-oxetanylmethoxy)methyl]ether, 1,4-bis[(3-methyl-3-oxetanylmethoxy)methyl]benzene, 1,4-bis[(3-ethyl-3-oxetanylmethoxy)methyl]benzene, (3-methyl-3-oxetanyl)methyl acrylate, (3-ethyl-3-oxetanyl)methyl acrylate, (3-methyl-3-oxetanyl)methyl methacrylate, (3-ethyl-3-oxetanyl)methyl methacrylate, or oligomer or copolymer thereof; and an ether compound of a compound having an oxetane group and a compound having a hydroxy group, for example, a novolac resin, poly(p-hydroxystyrene), a cardo-type bisphenol, a calixarene, a calixresorcinarene or silsesquioxane. In addition, a copolymer of an unsaturated monomer having an oxetane ring and an alkyl (meth)acrylate and the like are also exemplified.

Examples of the cyanate compound include a bis A type cyanate compound, a bis F type cyanate compound, a cresol novolac type cyanate compound and a phenol novolac type cyanate compound.

Also, as the crosslinking agent, melamine or a melamine derivative can be used.

Examples of the melamine derivative include methylolmelamine and an alkylated methylolmelamine (a compound obtained by etherifying a methylol group with methyl, ethyl, butyl or the like).

The crosslinking agents may be used individually or in combination of two or more thereof. The crosslinking agent is preferably melamine or an alkylated methylolmelamine, particularly preferably a hexamethylated methylolmelamine, in view of good preservation stability and effectiveness in increasing the surface hardness or film strength itself of the cured film (film after performing a crosslinking reaction due to the crosslinking agent with energy, for example, light or heat).

The curable resin composition according to the invention may or may not contain the crosslinking agent, and in the case where the curable resin composition contains the crosslinking agent, the content of the crosslinking agent is preferably from 1 to 40% by mass, more preferably from 3 to 20% mass, based on the total solid content mass of the curable resin composition.

[9] Curing Accelerator

The curable resin composition according to the invention may further contain a curing accelerator for the purpose of accelerating heat curing of the crosslinking agent, for example, the epoxy compound or oxetane compound described above.

Examples of the curing accelerator which can be used include an amine compound (for example, dicyandiamide, benzyldimethylamine, 4-(dimethylamino)-N,N-dimethylbenzylamine, 4-methoxy-N,N-dimethylbenzylamine or 4-methyl-N,N-dimethylbenzylamine), a quaternary ammonium salt compound (for example, triethylbenzylammonium chloride), a blocked isocyanate compound (for example, dimethylamine), an imidazole derivative dicyclic amidine compound or salt thereof (for example, imidazole, 2-methylimidazole, 2-ethylimidazole, 2-ethyl-4-methylimidazole, 2-phenylimidazole, 4-phenylimidazole, 1-cyanoethyl-2-phenylimidazole or 1-(2-cyanoethyl)-2-ethyl-4-methylimidazole), a phosphorus compound (for example, triphenylphosphine), a guanamine compound (for example, melamine, guanamine, acetoguanamine or benzoguanamine), and an S-triazine derivative (for example, 2,4-diamino-6-methacryloyloxyethyl-S-triazine, 2-vinyl-2,4-diamino-S-triazine, 2-vinyl-4,6-diamino-S-triazine-isocyanuric acid adduct or 2,4-diamino-6-methacryloyloxyethyl-S-triazine-isocyanuric acid adduct). The curing accelerator is preferably melamine or dicyandiamide.

The curing accelerators may be used individually or in combination of two or more thereof.

The curable resin composition according to the invention may or may not contain the curing accelerator, and in the case where the curable resin composition contains the curing accelerator, the content of the curing accelerator is ordinarily from 0.01 to 15% by mass based on the total solid content of the curable resin composition.

[10] Elastomer

The curable resin composition according to the invention may further contain an elastomer.

By incorporating the elastomer, the adhesion property between the substrate and the infrared ray cut filter can be more increased and the heat resistance, heat shock resistance, flexibility and toughness of the infrared ray cut filter can be more increased.

The elastomer which can be used in the invention is not particularly limited and may be appropriately selected according to the purpose. Examples thereof include a styrene-based elastomer, an olefin-based elastomer, a urethane-based elastomer, a polyester-based elastomer, a polyamide-based elastomer, an acrylic-based elastomer and a silicone-based elastomer. The elastomer is composed of a hard segment component and a soft segment component, wherein ordinarily, the former contributes to the heat resistance and strength and the latter contributes to the flexibility and toughness. Of the elastomers, a polyester-based elastomer is advantageous in view of compatibility with other materials.

The styrene-based elastomer specifically includes, for example, TUFPRENE, SOLPRENE T, ASAPRENE T and TUFTEC (produced by Asahi Chemical Industry Co., Ltd.), ELASTOMER AR (produced by Aronkasei Co., Ltd.), KRATON G and CALIFLEX (produced by Shell Chemicals Japan Ltd.), JSR-TR, TSR-SIS and DYNARON (produced by JSR Corp.), DENKA STR (produced by Denki Kagaku Kogyo Kabushiki Kaisha), QUINTAC (produced by ZEON Corp.), TPE-SB Series (produced by Sumitomo Chemical Co., Ltd.), RABALON (produced by Mitsubishi Chemical Corp.), SEPTON and HYBRAR (produced by Kuraray Co., Ltd.), SUMIFLEX (produced by Sumitomo Bakelite Co., Ltd.), LEOSTOMER and ACTYMER (produced by Riken Vinyl Industry Co., Ltd.).

Specific examples of the olefin-based elastomer include MILASTOMER (produced by Mitsui Petrochemical Industries, Ltd.), EXACT (produced by Exxon Chemical Corp.), ENGAGE (produced by Dow Chemical Co.), hydrogenated styrene-butadiene rubber (DYNABON HSBR produced by JSR Corp.), butadiene-acrylonitrile copolymer (NBR Series produced by JSR Corp.), crosslinking point-containing butadiene-acrylonitrile copolymer modified with carboxyl group at both terminals (XER Series produced by JSR Corp.) and epoxidized polybutadiene in which polybutadiene is partially epoxidized (BF-1000 produced by Nippon Soda Co., Ltd.).

Specific examples of the urethane-based elastomer include PANDEX T-2185 and T-2983N (produced by DIC Corp.) and SIRACTRAN E790.

Specific examples of the polyester-based elastomer include HYTREL (produced by Du Pont-Toray Co., Ltd.), PELPRENE (produced by Toyobo Co., Ltd.) and ESPEL (produced by Hitachi Chemical Co., Ltd.).

The polyamide-based elastomer specifically includes, for example, UBE Polyamide Elastomer (produced by Ube Industries, Ltd.), DAIAMIDE (produced by Daicel-Huels Ltd.), PEBAX (produced by Toray Industries, Inc.), GRILON ELY (EMS-CHEMIE (Japan) Ltd.), NOVAMID (produced by Mitsubishi Chemical Corp.) and GRILAX (produced by DIC Corp.).

The acrylic-based elastomer is obtained by copolymerizing an acrylic acid ester, for example, ethyl acrylate, butyl acrylate, methoxyethyl acrylate or ethoxyethyl acrylate with an epoxy group-containing monomer, for example, glycidyl methacrylate or allyl glycidyl ether and/or a vinyl-based monomer, for example, acrylonitrile or ethylene. Examples of the acrylic-based elastomer include an acrylonitrile-butyl acrylate copolymer, an acrylonitrile-butyl acrylate-ethyl acrylate copolymer and an acrylonitrile-butyl acrylate-glycidyl methacrylate copolymer.

Specific examples of the silicone-based elastomer include KE Series (produced by Shin-Etsu Chemical Co., Ltd.), SE Series, CY Series and SH Series (produced by Dow Corning Toray Silicone Co., Ltd.).

Other than the elastomers described above, a rubber-modified epoxy resin can be used. The rubber-modified epoxy resin is obtained by modifying a part or all of epoxy groups of, for example, the bisphenol F-type epoxy resin, bisphenol A-type epoxy resin, salicylaldehyde-type epoxy resin, phenol novolac-type epoxy resin or cresol novolac-type epoxy resin described above, with both terminal carboxylic acid-modified butadiene-acrylonitrile rubber, terminal amino-modified silicone rubber or the like.

Of the elastomers, from the standpoint of shear adhesion property and heat shock resistance, a both terminal carboxyl group-modified butadiene-acrylonitrile copolymer, a polyester-based elastomer having a hydroxy group (ESPEL 1612 and 1620 produced by Hitachi Chemical Co., Ltd.) and an epoxidized polybutadiene are preferred.

The curable resin composition according to the invention may or may not contain the elastomer, and in the case where the curable resin composition contains the elastomer, although the content of the elastomer is not particularly limited and may be appropriately selected according to the purpose, it is preferably from 0.5 to 30% by mass, more preferably from 1 to 10% by mass, particularly preferably from 3 to 8% by mass, based on the total solid content mass of the curable resin composition. It is advantageous that the content is in the preferred range described above because the shear adhesion property and heat shock resistance can be more improved.

[11] Surfactant

To the curable resin composition according to the invention may be added various surfactants from the standpoint of more improving the coating property. As the surfactant, various surfactants, for example, a fluorine-based surfactant, a nonionic surfactant, a cationic surfactant, an anionic surfactant or a silicone-based surfactant may be used.

In particular, by incorporating a fluorine-based surfactant into the curable resin composition according to the invention, the liquid property (particularly, fluidity) of a coating solution prepared from the curable resin composition can be more improved so that uniformity of the coating thickness and liquid saving property can be more improved.

Specifically, in the case of forming a film using a coating solution prepared from the curable resin composition containing a fluorine-based surfactant, the interfacial tension between a surface to be coated and the coating solution is reduced, whereby wettability of the surface to be coated is increased and the coating property onto the surface to be coated is improved. Therefore, even when a thin film of approximately several μm is formed using a smaller amount of the coating solution, it is effective from the standpoint that a film having a uniform thickness with small unevenness in thickness is more preferably formed.

The fluorine content in the fluorine-based surfactant is preferably from 3 to 40% by mass, more preferably from 5 to 30% by mass, and particularly preferably from 7 to 25% by mass. The fluorine-based surfactant having the fluorine content of the range described above is effective in view of the uniformity of the thickness of the coated film and liquid saving property and also exhibits good solubility in the curable resin composition.

The fluorine-based surfactant includes, for example, MEGAFAC F171, MEGAFAC F172, MEGAFAC F173, MEGAFAC F176, MEGAFAC F177, MEGAFAC F141, MEGAFAC F142, MEGAFAC F143, MEGAFAC F144, MEGAFAC R30, MEGAFAC F437, MEGAFAC F475, MEGAFAC F479, MEGAFAC F482, MEGAFAC F554, MEGAFAC F780 and MEGAFAC F781 (produced by DIC Corp.), FLUORAD FC430, FLUORAD FC431 and FLUORAD FC171 (produced by Sumitomo 3M Ltd.), and SURFLON S-382, SURFLON SC-101, SURFLON SC-103, SURFLON SC-104, SURFLON SC-105, SURFLON SC-1068, SURFLON SC-381, SURFLON SC-383, SURFLON S-393 and SURFLON KH-40 (produced by Asahi Glass Co., Ltd.).

The nonionic surfactant specifically includes, for example, polyoxyethylene lauryl ether, polyoxyethylene stearyl ether, polyoxyethylene oleyl ether, polyoxyethylene octylphenyl ether, polyoxyethylene nonylphenyl ether, polyethylene glycol dilaurate, polyethylene glycol distearate and a sorbitan fatty acid ester (for example, PLURONIC L10, L31, L61, L62, 10R5, 1782 and 25R2 and TETRONIC 304, 701, 704, 901, 904 and 150R1 produced by BASF, and SOLSPERSE 20000 produced by Zeneca).

The cationic surfactant specifically includes, for example, a phthalocyanine derivative (trade name: EFKA-745 produced by Morishita Sangyo K.K.), Organosiloxane Polymer KP341 (produced by Shin-Etsu Chemical Co., Ltd.), a (meth)acrylic acid (co)polymer (POLYFLOW No. 75, No. 90 and No. 95 (produced by Kyoeisha Chemical Co., Ltd.), and W001 (produced by Yusho Co Ltd.).

The anionic surfactant specifically includes, for example, W004, W005 and W017 (produced by Yusho Co Ltd.).

The silicone-based surfactant includes, for example, TORAY SILICONE DC3PA, TORAY SILICONE SH7PA, TORAY SILICONE DC11PA, TORAY SILICONE SH21PA, TORAY SILICONE SH28PA, TORAY SILICONE SH29PA, TORAY SILICONE SH30PA and TORAY SILICONE SH8400 produced by Dow Corning Toray Co., Ltd., TSF-4440, TSF-4300, TSF-4445, TSF-4460 and TSF-4452 produced by Momentive Performance Materials Inc., KP341, KF6001 and KF6002 produced by Shin-Etsu Silicone Co., Ltd., and BYK-323 and BYK-330 produced by Byk-Chemie GmbH.

The surfactants may be used individually or in combination of two or more thereof.

The curable resin composition according to the invention may or may not contain the surfactant, and in the case where the curable resin composition contains the surfactant, the content of the surfactant is preferably from 0.001 to 1% by mass, more preferably from 0.01 to 0.1% by mass, based on the total solid content mass of the curable resin composition.

[12] Other Components

In addition to the essential components and preferred additives described above, other components may be appropriately selected and used according to the purpose in the curable resin composition according to the invention so long as the effects of the invention are not impaired.

Examples of other components which can be used in combination include a heat curing accelerator, a thermal polymerization inhibitor and a plasticizer. Further, an adhesion accelerator to a surface of the substrate, and other auxiliary agents (for example, an electrically conductive particle, a filler, a defoaming agent, a flame retardant, a leveling agent, a release accelerator, an antioxidant, a perfume, a surface tension-controlling agent or a chain transfer agent) may be used in combination.

By appropriately incorporating such a component into the curable resin composition, the properties of the intended infrared ray absorbing filter, for example, stability or physical property of film can be adjusted.

The thermal polymerization inhibitor is described in detail, for example, in paragraphs 0101 to 0102 of JP-A-2008-250074.

The plasticizer is described in detail, for example, in paragraphs 0103 and 0104 of JP-A-2008-250074.

The adhesion accelerator is described in detail, for example, in paragraphs 0107 to 0109 of JP-A-2008-250074.

Any of the additives described in the patent document above is usable in the curable resin composition according to the invention.

[13] Solvent

The curable resin composition according to the invention preferably contains a solvent.

The solvent is not particularly limited, and a solvent capable of uniformly dissolving or dispersing each component of the curable rein composition according to the invention may be appropriately selected according to the purpose. Examples of the solvent include an alcohol, for example, methanol, ethanol, normal propanol, isopropanol, normal butanol, secondary butanol or normal hexanol; a ketone, for example, acetone, methyl ethyl ketone, methyl isobutyl ketone, cyclohexanone, diisobutyl ketone, cyclohexanone or cyclopentanone; an ester, for example, ethyl acetate, butyl acetate, normal amyl acetate, methyl sulfate, ethyl propionate, dimethyl phthalate, ethyl benzoate, propylene glycol monomethyl ether acetate or methoxypropyl acetate; an aromatic hydrocarbon, for example, toluene, xylene, benzene or ethylbenzene; a halogenated hydrocarbon, for example, carbon tetrachloride, trichloroethylene, chloroform, 1,1,1-trichloroethane, methylene chloride or monochlorobenzene; an ether, for example, tetrahydrofuran, diethyl ether, ethylene glycol monomethyl ether, ethylene glycol monoethyl ether, 1-methoxy-2-propanol or propylene glycol monomethyl ether; dimethylformamide, dimethylacetamide, dimethylsulfoxide and sulfolane. The solvents may be used individually or in combination of two or more thereof. Also, a known surfactant may be added.

The curable resin composition according to the invention thus-obtained has a solid content concentration preferably from 10 to 90% by mass, more preferably from 15 to 90% by mass, most preferably from 20 to 80% by mass, from the standpoint of being capable of forming a dye-containing layer having a film thickness of 20 µm or more which is preferably applicable to an image sensor chip.

The use of the curable resin composition according to the invention includes, for example, use in a dye-containing layer as a near infrared ray shielding film on a light-receiving side of a solid-state imaging device substrate (for example, for a dye-containing layer as a near infrared ray shielding film to a wafer level lens), use in a dye-containing layer as a near infrared ray shielding film on a rear side (opposite side to the light-receiving side) of a solid-state imaging device substrate or use in a dye-containing layer as a near infrared ray shielding film in an infrared ray cut filter, and is preferably use in a dye-containing layer as a near infrared ray shielding film on a light-receiving side of a solid-state imaging device substrate.

The viscosity of the curable resin composition according to the invention is preferably from 1 mPa·s to 1,000 Pa·s, more preferably from 10 mPa·s to 1,000 Pa·s, from the standpoint of thick film-forming property capable of forming a dye-containing layer having a film thickness of 20 µm or more and uniform coating property in the image sensor chip use. In the case where a coating method is spin coat or slit coat, the viscosity of the curable resin composition is preferably from 1 to 500 mPa·s, more preferably from 10 to 500 mPa·s, and most preferably from 20 to 100 mPa·s.

In particular, it is one preferred embodiment that the curable resin composition according to the invention contains a dye having a maximum absorption wavelength in a wavelength range from 600 to 850 nm and has a solid content concentration from 10 to 90% by mass and a viscosity at 25° C. from 1 mPa·s to 1,000 Pa·s.

In the case where a coating method is screen printing, the viscosity of the curable resin composition is preferably from 1 to 1,000 mPa·s, and most preferably from 5 to 200 mPa·s. Further, in the case of applicator coating, the viscosity of the curable resin composition is preferably from 10 mPa·s to 1 Pa·s, and most preferably from 300 to 700 mPa·s.

A formation method of the dye-containing layer includes a method of forming the dye-containing layer by coating the curable resin composition (coating solution prepared by dissolving, emulsifying or dispersing the solid content of the composition in the solvent described above) according to the invention directly on a support, followed by drying.

The coating method of the curable resin composition (coating solution) on the support is performed by using, for example, an applicator, a spin coater, a slit spin coater, a slit coater or screen printing. Also, it can be performed by using potting (drop cast method). The applicator coating means a coating method wherein after putting a drop of a coating solution on a substrate, the coating solution is coated to spread on the substrate by a rod-like instrument referred to as an applicator (with a gap of several hundred µm between the substrate and the rod).

From the standpoint of forming the dye-containing layer having a film thickness of 20 µm or more, a recoating wherein after coating, drying, and curing described later, the coating is further repeated plural times (preferably from 2 to 5 times) may be performed.

In particular, in the case of performing the applicator coating, it is preferred that the solid content concentration and the viscosity of the curable resin composition according to the invention are from 40 to 70% by mass and from 300 to 700 mPa·s, respectively. Also, the applicator coating is preferably performed in a slit width of the applicator from 300 to 500 µm and at a moving speed of the applicator from 2 to 5 cm/sec.

By using the applicator coating conditions as described above, the film thickness of the dye-containing layer can be set preferably 50 µm or more, more preferably from 100 to 300 µm, and still more preferably from 200 to 300 µm.

Also, from the standpoint of forming the dye-containing layer having a film thickness of 20 µm or more, as a method of coating the curable resin composition (coating solution) on the support, a drop cast method is preferred.

One example of the formation of the dye-containing layer (formation of the infrared ray cut filter according to the invention) using the drop cast method is described below.

First, a hydrophilic region is formed on a surface of support, and further a hydrophobic region is formed so as to surround the hydrophilic region. Then, the curable resin composition according to the invention is drop cast on a surface of the hydrophilic region surrounded with the hydrophobic region. Thus, a uniform film (near infrared ray cut filter using the curable resin composition according to the invention) can be formed on the surface of the hydrophilic region.

Another example of the formation of the dye-containing layer (formation of the infrared ray cut filter according to the invention) using the drop cast method is described below.

First, a hydrophilic region is formed on a surface of support, and a resist composition is applied to a surface of the hydrophilic region. Next, the resist composition is subjected to patterning by lithography to from a resist pattern. As a result, the hydrophilic region surrounded with the resist pattern (hydrophobic region) is formed. Then, the curable resin composition according to the invention is applied to the hydrophilic region surrounded with the resist pattern. Subsequently, by removing the resist pattern a uniform film (near infrared ray cut filter using the curable resin composition according to the invention) can be formed on the support. By using the region where the resist pattern has been present as a cutting region, the near infrared ray cut filter can be produced without causing peeling of the near infrared ray cut filter.

It is preferred to have a step of drying the curable resin composition according to the invention applied to the support.

The drying method includes a method of drying by allowing to stand at room temperature and a method of drying by heating. In the case of drying by allowing to stand at room temperature, the drying time is not particularly limited and, for example, it is preferably 6 hours or more, more preferably 12 hours or more, and still more preferably 18 hours or more.

The method of drying by heating is not particularly limited. As described later, in the case where the curable resin composition according to the invention contains water and a polar solvent having a boiling point of 100° C. or higher, a method of continuously heating the curable resin composition according to the invention applied onto the support or a method of heating it in at least two stages of a temperature of 100° C. or less and a temperature exceeding 100° C. is preferred. In this case, since the water is volatilized first and the polar solvent having a boiling point of 100° C. or higher is volatilized later, when the curable resin composition according to the invention applied onto the support is heated, the curable resin composition according to the invention tends to be hard to be dried or cured rapidly. As a result, it is believed that since progress of drying or curing in the surface vicinity of the film and the inside of the film can be uniformed, when a thick film is formed, the surface state defect can be more effectively inhibited.

In the case of the continuously heating of the curable resin composition according to the invention applied onto the support, it is preferred to continuously raise temperature over a temperature from 100° C. or less to a temperature exceeding 100° C. A temperature range for the continuous heating is preferably from 40 to 200° C., more preferably from 50 to 180° C., and still more preferably from 60 to 140° C. Also, the total time for the continuous heating is preferably from 20 to 200 minutes, more preferably from 30 to 100 minutes, and still more preferably from 40 to 80 minutes. It is preferred, for example, to raise temperature at 1 to 20° C./min.

In the case of the heating in at least two stages of a temperature of 100° C. or less and a temperature exceeding 100° C., it is only necessary to heat in at least one stage at the temperature of 100° C. or less (preferably 95° C. or less, more preferably 90° C. or less, still more preferably 85° C. or less) and the temperature exceeding 100° C. (preferably 105° C. or more, more preferably 110° C. or more, still more preferably 115° C. or more), respectively, and it is preferred to heat in two or more stages of a temperature of 100° C. or less and a temperature exceeding 100° C., respectively. In the case of the heating in two stages of a temperature of 100° C. or less and a temperature exceeding 100° C., a temperature difference in the stages is preferably from 10° C. or more, more preferably 15° C. or more, and still more preferably 20° C. or more.

It is preferred, for example, to heat in a range from 50 to 70° C., then to heat in a range from 70 to 90° C., then to heat in a range from 90 to 110° C., then to heat in a range from 110 to 130° C., and then to heat in a range from 130 to 150° C.

The time for heating at each temperature may be the same or different, and is preferably from 1 to 40 minutes, more preferably from 5 to 30 minutes, and still more preferably from 5 to 15 minutes.

The heating device is not particularly limited, can be appropriately selected from known devices according to the purpose, and includes, for example, a dry oven, a hot plate and an IR heater.

Further, the drying conditions of the coated film may be varied depending on the kinds of each component and solvent, the use ratio and the like, and are ordinarily at a temperature from 60 to 150° C. for approximately from 30 seconds to 15 minutes.

The support may be a solid-state imaging device substrate, another substrate (for example, a glass substrate 30 described later) provided on the light-receiving side of the solid-state imaging device substrate or a low refractive index layer or the like provided on the light-receiving side of the solid-state imaging device substrate.

The film thickness of the dye-containing layer is preferably 20 μm or more, more preferably from 20 to 300 μm, still more preferably from 20 to 200 μm, particularly preferably from 30 to 150 μm, most preferably from 40 to 120 μm, from the standpoint of being capable of preferably applying to an image sensor chip. The film thickness is appropriately adjusted by the dye used, but by coating in such a thick film the desired infrared ray cut function can be achieved without limitation of the kind of dye used.

Further, the dye-containing layer may be composed of multiple layers. For example, a copper complex is incorporated into a first dye-containing layer (copper complex-containing layer) and a dye different from the copper complex (preferably a pyrrolopyrrole dye) is incorporated into a second dye-containing layer. The film thickness of the copper complex-containing layer is preferably composed of the thick layer described above, and specifically 50 μm or more. The film thickness of the second dye-containing layer is preferably 10 μm or less, more preferably 5 μm or less, and particularly preferably 3 μm or less. By using two different kinds of dyes in combination, light having the desired wavelength can be shielded, and by covering the second dye-containing layer with the copper complex-containing layer, even when the heat resistance of the dye in the second dye-containing layer is insufficient, it can endure the reflow process.

The method of forming the dye-containing layer using the curable resin composition according to the invention may contain other steps.

The other steps are not particularly limited, can be appropriately selected according to the purpose, and include, for example, a surface treatment step of substrate, a pre-heating step (prebake step), a curing treatment step and a post-heating step (postbake step).

<Pre-Heating Step and Post-Heating Step>

The heating temperature in the pre-heating step and post-heating step is ordinarily from 80 to 200° C., and preferably from 90 to 150° C.

The heating time in the pre-heating step and post-heating step is ordinarily from 30 to 240 seconds, and preferably from 60 to 180 seconds.

<Curing Treatment Step>

The curing treatment step is a step of applying a curing treatment to the film formed, if desired. By conducting the treatment, the mechanical strength of the dye-containing layer is enhanced.

The curing treatment step is not particularly limited, can be appropriately selected according to the purpose, and preferably includes, for example, an entire surface exposure treatment and an entire surface heating treatment. The term "exposure" as used in the invention means and includes not only exposure to light having various wavelengths but also irradiation with radiation, for example, an electron beam or an X-ray.

The exposure is preferably performed by the irradiation with radiation and as the radiation usable at the exposure, in particular, an electron beam, KrF, ArF, an ultraviolet light, for example, g-line, h-line or i-line, or visible light is preferably used. KrF, g-line, h-line or i-line is preferred.

Examples of the exposure system include stepper exposure and exposure with a high-pressure mercury lamp.

The exposure amount is preferably from 5 to 3,000 mJ/cm$^2$, more preferably from 10 to 2,000 mJ/cm$^2$, and most preferably from 50 to 1,000 mJ/cm$^2$.

Examples of the method for the entire surface exposure treatment include a method of exposing the entire surface of the film formed. By the entire surface exposure, in the case where the curable resin composition contains a polymerizable compound, curing of the polymerization component in the film formed from the curable resin composition is accelerated and curing of the film formed is further proceeds, thereby improving the mechanical strength and durability.

The apparatus for conducting the entire surface exposure is not particularly limited, can be appropriately selected according to the purpose, and preferably includes an UV exposure machine, for example, an ultrahigh-pressure mercury lamp.

Also, the method for the entire surface heating treatment includes a method of heating the entire surface of the film formed. BY the entire surface heating, the film strength of the pattern is enhanced.

The heating temperature at the entire surface heating is preferably from 120 to 250° C., and more preferably from 120 to 250° C. When the heating temperature is 120° C. or more, the film strength is increased by the heat treatment, and when the heating temperature is 250° C. or less, the occurrence of decomposition of the components in the film to weaken and embrittle the film quality can be prevented.

The heating time in the entire surface heating is preferably from 3 to 180 minutes, and more preferably from 5 to 120 minutes.

The apparatus for conducting the entire surface heating is not particularly limited, can be appropriately selected from known apparatuses according to the purpose, and includes, for example, a dry oven, a hot plate and an IR heater.

The dye-containing layer obtained by using the curable resin composition according to the invention described above has a high light-shielding property in the near infrared region around wavelength of 700 nm (near infrared ray shielding property) and a high light-transmitting property in the visible region (visible light transmitting property) because it is formed from the curable resin composition according to the invention.

<Camera Module>

The invention also relates to a camera module comprising a solid-state imaging device substrate and the dye-containing layer provided on a light-receiving side of the solid-state imaging device substrate.

The camera module according to one preferred embodiment of the invention is described below with reference to FIG. 1 and FIG. 2, but the invention should not be construed as being limited thereto.

Figure 2:
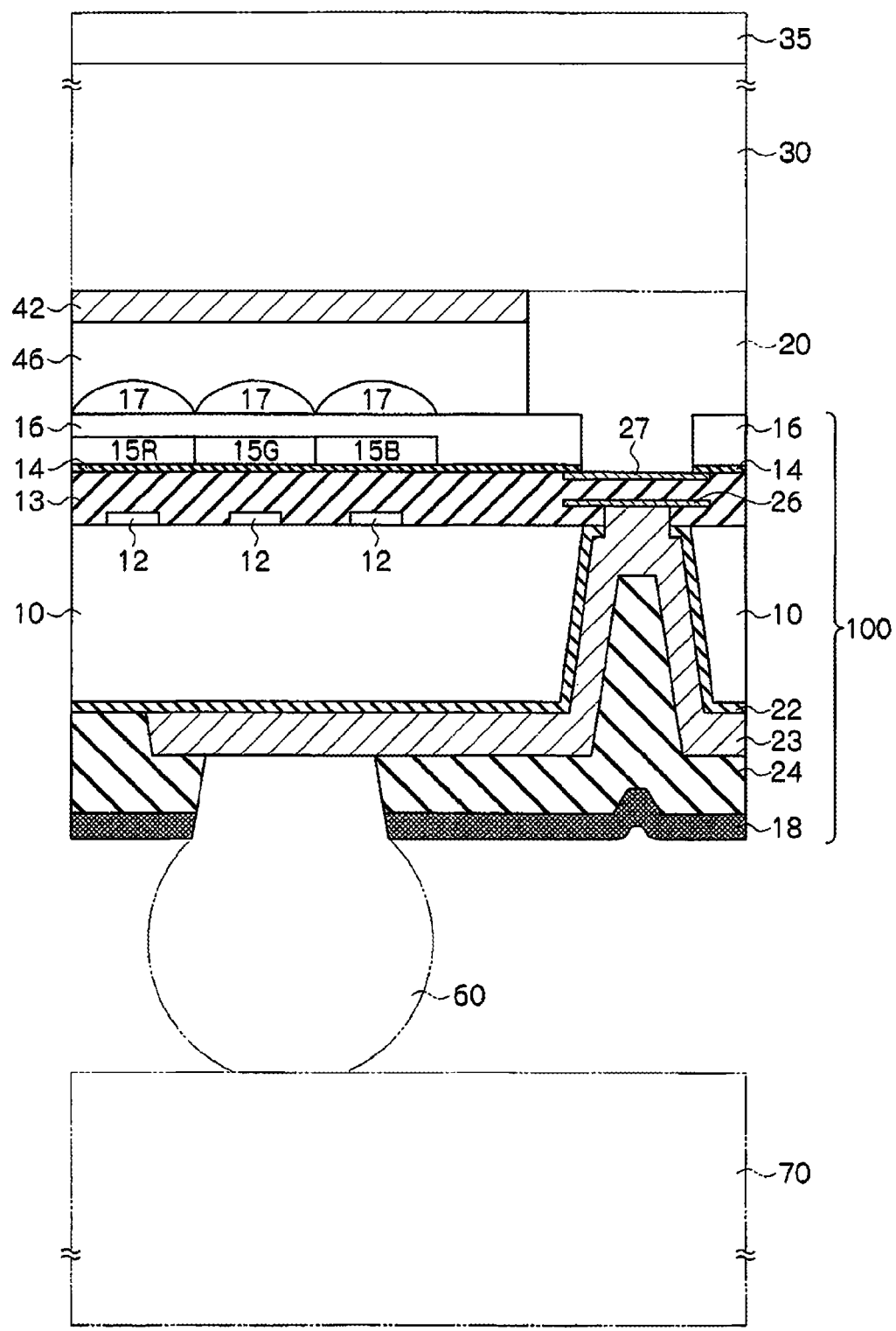
FIG. 2 is a schematic cross-sectional view of the solid-state imaging device substrate according to an embodiment of the invention.

The portions common between FIG. 1 and FIG. 2 are indicated by a common reference numeral or sign.

Also, in the description, the terms "top", "above" and "upper side" each indicates a side farther from a silicon substrate 10, and the terms "bottom", "below" and "lower side" each indicates a side closer to the silicon substrate 10.

FIG. 1 is a schematic cross-sectional view showing a configuration of a camera module equipped with an image sensor chip.

The camera module 200 shown in FIG. 1 is connected to a circuit board 70 as a mounting substrate through a solder ball 60 as a connection member.

More specifically, the camera module 200 is configured to comprise a solid-state imaging device substrate 100 having an image-forming device unit on a first major surface of a silicon substrate, a dye-containing layer 42 provided on the solid-state imaging device substrate 100, a glass substrate 30 (light-transmitting substrate) disposed above the dye-containing layer 42, an infrared ray reflecting film 35 disposed above the glass substrate 30, a lens holder 50 having an imaging lens 40 in an internal space and being disposed above the glass substrate 30, and a light-shielding and electromagnetic shield 44 disposed so as to surround the periphery of the solid-state imaging device substrate 100 and the glass substrate 30. Respective members are adhered using adhesives 20 (not shown in FIG. 1) and 45.

In the camera module 200, incident light hv from the outside sequentially passes through the imaging lens 40, the infrared ray reflecting film 35, the glass substrate 30 and the dye-containing layer 42 so as to reach the imaging device unit of the solid-state imaging device substrate 100.

Also, the camera module 200 is connected to a circuit board 70 through the solder ball 60 (connection material) on the second major surface side of the solid-state imaging device substrate 100.

FIG. 2 is an enlarged cross-sectional view of the solid-state imaging device substrate 100 in FIG. 1.

The solid-state imaging device substrate 100 is configured to comprise a silicon substrate 10 as a base material, an imaging device 12, an interlayer insulating film 13, a base layer 14, a red color filter 15R, a green color filter 15G, a blue color filter 15B, an overcoat 16, a high refractive index layer (microlens) 17, a low refractive index layer, a light-shielding film 18, an insulating film 22, a metal electrode 23, a solder resist layer 24, an internal electrode 26 and a device surface electrode 27.

However, the solder resist layer 24 may be omitted.

First, the configuration on the first major surface side (light-receiving side) of the solid-state imaging device substrate 100 is mainly described below.

As shown in FIG. 2, an imaging device unit where a plurality of imaging devices 12, for example, CCD and CMOS are two-dimensionally arrayed is provided on the first major surface side of the silicon substrate 10 which is the base material of the solid-state imaging device substrate 100.

The interlayer insulating film 13 is formed on the imaging device 12 in the imaging device unit, and the base layer 14 is formed on the interlayer insulating film 13. Further, the red color filter 15R, the green color filter 15G and the blue color filter 15B (hereinafter, these are collectively referred to as a "color filter 15" sometimes) corresponding to respective imaging devices 12 are disposed on the base layer 14, respectively.

A light-shielding film not shown may be provided in the boundaries of the red color filter 15R, the green color filter 15G and the blue color filter 15B and in the periphery of the imaging device unit. The light-shielding film can be produced, for example, using a known black color resist.

The overcoat 16 is formed on the color filter 15, and the high refractive index layer 17 is formed on the overcoat 16 so as to correspond to the imaging device 12 (color filter 15).

Further, the low refractive index layer 46 is provided on the high refractive index layer 17.

Also, in the periphery of the imaging device unit on the first major surface side, a peripheral circuit (not shown) and the internal electrode 26 are provided, and the internal electrode 26 is electrically connected to the imaging device 12 through the peripheral circuit.

Further, the device surface electrode 27 is formed on the internal electrode 26 through the interlayer insulating film 13. In the interlayer insulating film 13 between the internal electrode 26 and the device surface electrode 27, a contact plug (not shown) for electrically connecting these electrodes is formed. The device surface electrode 27 is used for voltage application, signal reading and the like though the contact plug and the internal electrode 26.

The base layer 14 is formed on the device surface electrode 27. The overcoat 16 is formed on the base layer 14. The base layer 14 and the overcoat 16 formed on the device surface electrode 27 are opened to form a pad opening and to expose a part of the device surface electrode 27.

On the first major surface side of the solid-state imaging device substrate 100, the adhesive 20 is provided in the periphery of the imaging device unit, and the solid-state imaging device substrate 100 and the glass substrate 30 are adhered through the adhesive 20.

The silicon substrate 10 has a through-hole penetrating the silicon substrate 10, and a penetrating electrode which is a part of the metal electrode 23 is provided in the through-hole. The imaging device unit and the circuit board 70 are electrically connected by the penetrating electrode.

Next, the configuration on the second major surface side of the solid-state imaging device substrate 100 is mainly described below.

On the second major surface side, the insulating film 22 is formed from the second major surface to the inner wall of the through-hole.

On the insulating film 22, the metal electrode 23 patterned to extend from the region on the second major surface of the silicon substrate 10 to the inside of the through hole is provided. The metal electrode 23 is an electrode for connecting the imaging device unit in the solid-state imaging device substrate 100 and the circuit board 70.

The penetrating electrode is the portion formed inside the through hole of the metal electrode 23. The penetrating electrode penetrates the silicon substrate 10 and a part of the interlayer insulating film and reaches the lower side of the internal electrode 26 to be electrically connected to the internal electrode 26.

Further, on the second major surface side, the solder resist layer 24 (protective insulating film) covering the second major surface on which the metal electrode 23 is formed and having an opening to expose a part of the metal electrode 23 is provided.

Further, on the second major surface side, the light-shielding film 18 covering the second major surface on which the solder resist layer 24 is formed and having an opening to expose a part of the metal electrode 23 is provided.

In FIG. 2, although the light-shielding film 18 is patterned so as to cover a part of the metal electrode 23 and to expose the remaining portion, it may be patterned to expose the entirety of the metal electrode 23 (the same applies to the patterning of the solder resist layer 24).

Also, the solder resist layer 24 may be omitted and the light-shielding film 18 may be formed directly on the second major surface where the metal electrode 23 is formed.

The solder ball 60 as a connection member is provided on the exposed metal electrode 23, and the metal electrode 23 of the solid-state imaging device substrate 100 and a connection electrode not shown of the circuit board 70 are electrically connected through the solder ball 60.

The configuration of the solid-state imaging device substrate 100 has been described above, and the solid-state imaging device substrate 100 can be formed by a known method, for example, a method described in paragraphs 0033 to 0068 of JP-A-2009-158863 or a method described in paragraphs 0036 to 0065 of JP-A-2009-99591.

The interlayer insulating film 13 is formed, for example, by sputtering or CVD (chemical vapor deposition) as an $SiO_2$ film or an SiN film.

The color filter 15 is formed by photolithography, for example, using a known color resist.

The overcoat 16 and the base layer 14 are formed by photolithography using, for example, a known resist for forming an organic interlayer film.

The microlens 17 is formed, for example, by photolithography using a styrene-based resin or the like.

The solder resist layer 24 is preferably formed by photolithography using a known solder resist containing, for example, a phenolic resin, a polyimide-based resin or an amine-based resin.

The solder ball 60 is formed as a sphere having, for example, a diameter from 100 to 1,000 μm (preferably a diameter from 150 to 700 μm).

The internal electrode 26 and the device surface electrode 27 are formed, for example, by CMP (chemical mechanical polishing) or photolithography and etching, as a metal electrode, for example, of Cu.

The metal electrode 23 is formed as a metal electrode, for example, of Cu, Au, Al, Ni, W, Pt, Mo, a Cu compound, a W compound or a Mo compound. The metal electrode 23 may have a sing-layer configuration or a multilayer configuration composed of two or more layers. The film thickness of the metal electrode 23 is, for example, from 0.1 to 20 μm (preferably from 0.1 to 10 μm). The silicon substrate 10 is not particularly limited, and a silicon substrate thinned by grinding the back surface of the substrate may be used. The thickness of the substrate is not limited and, for example, a silicon wafer having a thickness from 20 to 200 μm (preferably from 30 to 150 μm) is used.

The through-hole of the silicon substrate 10 is formed, for example, by photolithography or RIE (reactive ion etching).

One embodiment of the camera module has been described hereinbefore with reference to FIG. 1 and FIG. 2, but the embodiment above is not limited to the configuration of FIG. 1 and FIG. 2.

Also, the invention relates to an infrared ray cut filter comprising the dye-containing layer described above, as an infrared ray shielding film, provided on a light-transmitting substrate, for example, a glass substrate.

The infrared ray cut filter according to the invention may be an infrared ray cut filter comprising two or more dye-containing layers, as a near infrared ray shielding film, provided on a light-transmitting substrate.

For example, an infrared ray cut filter comprising a first dye-containing layer containing a copper complex and a second dye-containing layer containing a pyrrolopyrrole dye is preferred from the standpoint of the heat resistance in the reflow process.

The infrared ray cut filter comprising two or more dye-containing layers can be formed by coating, drying, and curing described later using a curable resin composition containing a dye having a maximum absorption wavelength in a wavelength range from 600 to 850 nm to from a dye-containing layer, and then using a curable resin composition containing a dye which is different from the dye described above and may have a maximum absorption wavelength in a wavelength range from 600 to 850 nm.

The infrared ray cut filter according to the invention can be subjected to a solder reflow process. The production of camera module by the solder reflow process makes automatic mounting of electronic component mounting substrate and the like requiring to perform soldering possible, and productivity can be significantly improved in comparison with the case where the solder reflow process is not used. Further, since the mounting can be performed automatically, it is possible to reduce the cost. In the case where the infrared ray cut filter is subjected to the solder reflow process, since the infrared ray cut filter is exposed to a temperature approximately from 250 to 270° C., it is preferred for the infrared ray cut filter to have heat resistance endurable the solder reflow process (hereinafter, also referred to as "solder reflow resistance").

In the specification, the phrase "having a solder reflow resistance" means that the property of the infrared ray cut filter is maintained before and after performing the heating at 250° C. for 10 minutes. More preferably, the property is maintained before and after performing the heating at 260° C. for 10 minutes. Still more preferably, the property is maintained before and after performing the heating at 270° C. for 3 minutes. In the case of having no solder reflow resistance, when the infrared ray cut filter is maintained under the conditions described above, the infrared ray absorbing ability of the infrared ray cut filter deteriorates and the function as a film becomes insufficient in some cases.

Further, the invention relates to a production method of camera module including a step of the reflow processing.

The infrared ray cut filter according to the invention can maintain the infrared ray absorbing ability even when it is subjected to the solder reflow process so that the characteristics of compact, lightweight and high-performance camera module are not destroyed.

As described above, in the case of performing the solder reflow process, since a reflow furnace is heated with hot air, a far infrared ray or the like, the infrared ray cut filter is required to have heat resistance capable of responding to the reflow temperature.

<Image Sensor Chip and Production Method Thereof>

The invention also relates to an image sensor chip which can be preferably used for the camera module described above and a production method thereof.

Figure 3A:
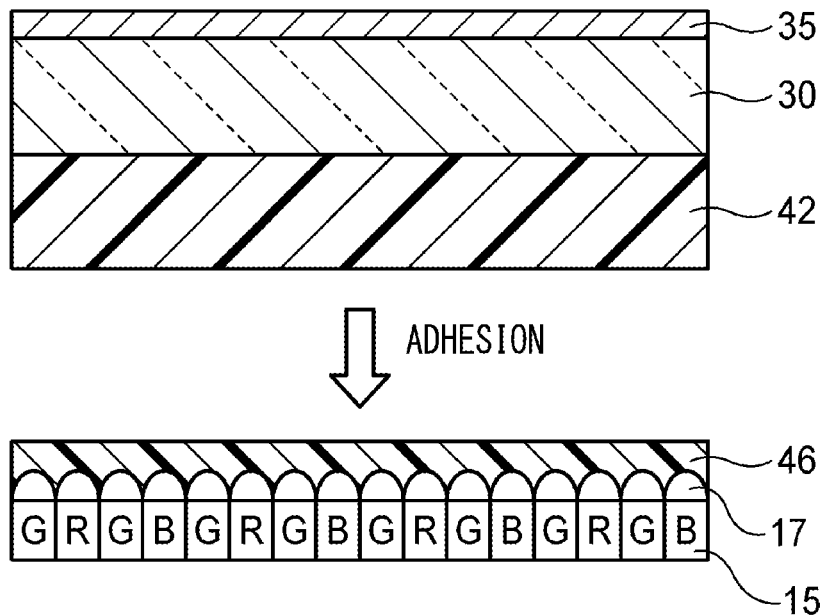
FIG. 3A and FIG. 3B are schematic cross-sectional views showing an embodiment of the production method of image sensor chip according to the invention.
Figure 3B:
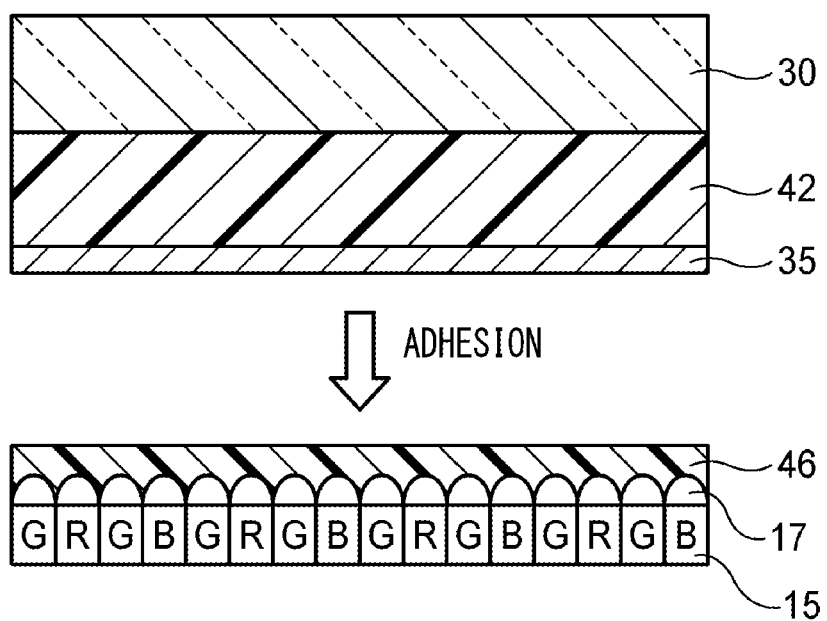

FIG. 3A and FIG. 3B are both schematic cross-sectional views showing an embodiment of the production method of image sensor chip according to the invention.

As shown in FIG. 3A and FIG. 3B, the production method of image sensor chip according to the invention comprises a step of coating the curable resin composition described above on a glass substrate 30 to form a dye-containing layer 42, and a step of adhering the glass substrate 30 having the dye-containing layer 42 formed onto a solid-state imaging device substrate 100 (in FIGS. 3A and 3B, a low refractive index layer 46 of the substrate).

As shown in FIG. 3A and FIG. 3B, it is preferred that the glass substrate 30 further has an infrared ray reflecting film 35.

According to the production method of image sensor chip of the invention, an image sensor chip comprising a solid-state imaging device substrate 100 (in FIGS. 3A and 3B, a low refractive index layer 46 of the substrate), a dye-containing layer 42 and a glass substrate 30 having an infrared ray reflecting film 35, wherein these members are closely contacted with each other without intervention of an air layer can be produced.

In the production method of image sensor chip according to the invention, a surface of the glass substrate 30 on which the infrared ray reflecting film 35 is not formed (surface on which the dye-containing layer 42 is formed) may be adhered to the solid-state imaging device substrate 100 as the embodiment shown in FIG. 3A or a surface of the glass substrate 30 on which the infrared ray reflecting film 35 is formed may be adhered to the solid-state imaging device substrate 100 as the embodiment shown in FIG. 3B.

According to the embodiment of the production method of image sensor chip of the invention shown in FIG. 3A, an image sensor chip having the infrared ray reflecting film 35 on a surface of the glass substrate 30 opposite to the dye-containing layer 42 can be produced.

According to the embodiment of the production method of image sensor chip of the invention shown in FIG. 3B, an image sensor chip having the infrared ray reflecting film 35 between the dye-containing layer 42 and the solid-state imaging device substrate 100 (in FIGS. 3A and 3B, a low refractive index layer 46 of the substrate) can be produced.

According to the invention, a stack containing a dye-containing layer 42 as a near infrared ray shielding film, a glass substrate 30 and an infrared ray reflecting film 35 is able to function as an infrared ray cut filter.

In the invention, the infrared ray reflecting film 35 is not particularly limited, and is preferably a dielectric multilayer film. The dielectric multilayer film for use in the invention is a film having a function of reflecting and/or absorbing a near infrared ray.

According to the invention, on a solid-state imaging device substrate 100 (in FIGS. 3A and 3B, a low refractive index layer 46 of the substrate), a stack in which a dye-containing layer 42 formed from the curable resin composition described above, a glass substrate 30 and a dielectric multilayer film as an infrared ray reflecting film 35 are continuously provided in this order may be formed as the embodiment shown in FIG. 3A, or a stack in which a dielectric multilayer film as an infrared ray reflecting film 35, a dye-containing layer 42 and a glass substrate 30 are continuously provided in this order may be formed as the embodiment shown in FIG. 3B.

As a material of the dielectric multilayer film, for example, ceramic can be used. In order to form a near infrared ray cut filter utilizing the interference effect of light, it is preferred to use two or more ceramics having different refractive indexes.

Alternatively, it is also preferred to use a noble metal film having an absorption in the hear infrared region by considering the thickness and the number of layers so as not to affect the transmittance of visible light of the near infrared ray cut filter.

As the dielectric multilayer film, specifically, a structure in which a high refractive index material and a low refractive index material are alternatively stacked can be preferably used.

As a material constituting the high refractive index material layer, a material having a refractive index of 1.7 or more can be used, and a material having a refractive index ranging from 1.7 to 2.5 is ordinarily selected.

As the material, for example, titanium oxide (titania), zirconium oxide, tantalum pentoxide, niobium pentoxide, lanthanum oxide, yttrium oxide, zinc oxide, zinc sulfide, indium oxide, and materials containing these oxides as the main component and a small amount of titanium oxide, tin oxide and/or cerium oxide are exemplified. Among them, titanium oxide (titania) is preferred.

As a material constituting the low refractive index material layer, a material having a refractive index of 1.6 or less can be used, and a material having a refractive index ranging from 1.2 to 1.6 is ordinarily selected.

As the material, for example, silica, alumina, lanthanum fluoride, magnesium fluoride and sodium aluminum hexafluoride are exemplified. Among them, silica is preferred.

The thickness of each of the high refractive index material layer and the low refractive index material layer is ordinarily a value from 0.1 to 0.5λ, wherein λ (nm) is a wavelength of infrared ray to be shielded. When the thickness is out of the range described above, the product (n×d) of the refractive index (n) and the film thickness (d) is widely different from the optical film thickness calculated from λ/4 and the relationship between the optical properties of reflection and refraction collapses so that the blocking and transmission of a specific wavelength tends to be difficult to control.

Further, the number of layers in the dielectric multilayer film is preferably from 5 to 50 layers, and more preferably from 10 to 45 layers.

The formation method of the dielectric multilayer film is not particularly limited, and includes, for example, a method wherein a high refractive index material and a low refractive index material are alternatively stacked, for example, by a CVD method, a sputtering method or a vacuum deposition method to form a dielectric multilayer film and the dielectric multilayer film is adhered to the film described above with an adhesive or a method wherein a high refractive index material and a low refractive index material are alternatively stacked directly on the film described above, for example, by a CVD method, a sputtering method or a vacuum deposition method to form to form a dielectric multilayer film.

Further, in the case where a warp occurs in the substrate when a dielectric multilayer film is deposited, in order to solve the problem, a method may be taken, for example, of depositing the dielectric multilayer film onto the both surface of the substrate or of irradiating radiation, for example, an ultraviolet ray on the surface of the substrate on which the dielectric multilayer film is deposited. In the case of irradiating radiation, the irradiation may be performed while conducting the deposition of dielectric multilayer film, or may be separately performed after the deposition.

In the production method of image sensor chip according to the invention, the glass substrate 30 further has an antireflection film (not shown in FIGS. 3A and 3B).

For example, the infrared ray reflecting film 35 may be formed on one surface of the glass substrate 30 and the antireflection film may be formed on the other surface of the glass substrate 30.

By the further formation of the antireflection film on the glass substrate 30, the antireflection film is further provided on the outermost surface of the image sensor chip comprising the solid-state imaging device substrate 100, the dye-containing layer 42 and the glass substrate 30 having the infrared ray reflecting film 35.

The antireflection film for use in the invention is not particularly limited so long as it can prevent or reduce the reflection of visible light.

The antireflection film can be formed, for example, by stacking from 1 to 5 layers of the high refractive index material and the low refractive index material described as to the dielectric multilayer film using, for example, a CVD method, a sputtering method or a vacuum deposition method. In addition, a method wherein a heat and/or UV curable material is coated on a surface of glass substrate 30, fine shape, for example, conical shape having from several tens to several hundred nm order is transferred onto the material using a mold or the like, and the material is cured with heat and/or UV to form an antireflection film, or a method (wet coating) wherein sol-gel materials having different refractive indexes (material containing a colloidal substance obtained by hydrolysis and polymerization of an alkoxide or the like dispersed in a solution) are coated to stack, thereby forming an antireflection film can be used. In the case of using the sol-gel material, curing is ordinarily performed using heat, but the antireflection film may be formed by using an energy ray (for example, an ultraviolet ray) to generate an acid or the like, which is a condensation catalyst, thereby performing curing, that is, so-called photocuring (JP-A-2000-109560 and JP-A-2000-1648).

Among them, from the standpoint that the material and equipment used in the formation of dielectric multilayer film are used as they are, a method of forming the antireflection film in the same manner as in the formation of dielectric multilayer film, or from the standpoint of increase in productivity, a method of forming the antireflection film by the wet coating described above can be preferably used.

The thickness of the antireflection film is not particularly limited so long as the effect of the invention is not damaged, and it is preferably from 0.01 to 1.0 μm, and more preferably from 0.05 to 0.5 μm.

Further, as the infrared ray reflecting film 35 and the antireflection film, the dielectric multilayer film and the antireflection film used in the examples described in paragraph 0083 or later of JP-A-2013-68688 can also be used.

EXAMPLE

Examples of the invention will be described below, but the invention should not be construed as being limited thereto. All "part" and "%" therein are mass basis unless otherwise specified.

Also, the measurement of viscosity in the examples below was conducted using a viscosity measuring device (RE85L Model Viscometer produced by Told Sangyo Co., Ltd.) under the conditions described below.
Rotor: Standard cone rotor for RE85L Model Viscometer 1° 34'×R24
Rotation number: setting appropriately in a range from 0.5 to 100 rpm depending on viscosity of the material to be measured
Measurement temperature: 25° C.

Preparation of Curable Resin Composition

Example 1

The composition components described below were mixed by a mixer to prepare a curable resin composition of Example 1.

| | |
|---|---|
| Phthalocyanine-based dye A (EXCOLOR TX-EX 720 produced by Nippon Shokubai Co., Ltd.; maximum absorption wavelength ($\lambda_{max}$) = 720 nm (film)) | 0.5 parts by mass |

| | |
|---|---|
| Polymerizable compound 1 shown below | 25 parts by mass |
| Polymerizable compound 2 shown below | 25 parts by mass |
| Propylene glycol monomethyl ether acetate (PEGMEA) | 49.5 parts by mass |

Polymerizable Compound 1

[Chem. 11]

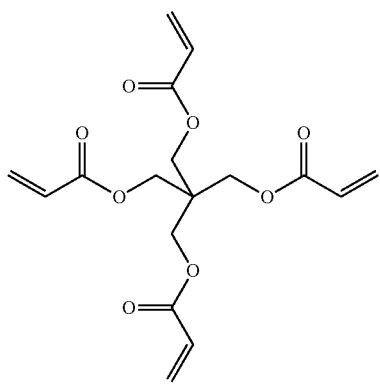

Polymerizable Compound 2

[Chem. 12]

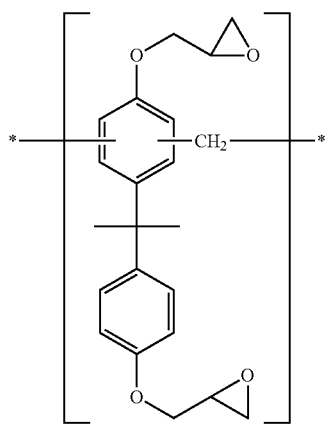

Example 2

A curable resin composition of Example 2 was prepared in the same manner as in Example 1 except that 0.25 parts by mass of Phthalocyanine-based dye A described and 0.25 parts by mass of Phthalocyanine-based dye B (EXCOLOR TX-EX 708K produced by Nippon Shokubai Co., Ltd.; maximum absorption wavelength ($\lambda_{max}$)=755 nm (film)) were used in place of 0.5 parts by mass of Phthalocyanine-based dye A.

Example 3

A curable resin composition of Example 3 was prepared in the same manner as in Example 1 except that 0.25 parts by mass of Phthalocyanine-based dye A described above and 0.25 parts by mass of a cyanine-based dye (Daito Chmix 1371F produced by Daito Chemix Corp.; maximum absorption wavelength ($\lambda_{max}$)=805 nm (film)) were used in place of 0.5 parts by mass of Phthalocyanine-based dye A.

Example 4

A curable resin composition of Example 4 was prepared in the same manner as in Example 1 except that 0.25 parts by mass of Phthalocyanine-based dye A described above and 0.05 parts by mass of a quatenylene-based dye (Lumogen IR765 produced by BASF; maximum absorption wavelength ($\lambda_{max}$)=705 nm (film)) were used in place of 0.5 parts by mass of Phthalocyanine-based dye A.

Example 5

A curable resin composition of Example 5 was prepared in the same manner as in Example 1 except that 0.5 parts by mass of Phthalocyanine-based dye B (EXCOLOR TX-EX 708K produced by Nippon Shokubai Co., Ltd.; maximum absorption wavelength ($\lambda_{max}$)=755 nm (film)) was used in place of 0.5 parts by mass of Phthalocyanine-based dye A.

Example 6

A curable resin composition of Example 6 was prepared in the same manner as in Example 1 except that 0.25 parts by mass of Phthalocyanine-based dye B (EXCOLOR TX-EX 708K produced by Nippon Shokubai Co., Ltd.; maximum absorption wavelength ($\lambda_{max}$)=755 nm (film)) and 0.25 parts by mass of a cyanine-based dye (Daito Chmix 1371F produced by Daito Chemix Corp.; maximum absorption wavelength ($\lambda_{max}$)=805 nm (film)) were used in place of 0.5 parts by mass of Phthalocyanine-based dye A.

Example 7

A curable resin composition of Example 7 was prepared in the same manner as in Example 1 except that 0.25 parts by mass of Phthalocyanine-based dye B (EXCOLOR TX-EX 708K produced by Nippon Shokubai Co., Ltd.; maximum absorption wavelength ($\lambda_{max}$)=755 nm (film)) and 0.25 parts by mass of a quaterrylene-based dye (Lumogen IR765 produced by BASF; maximum absorption wavelength ($\lambda_{max}$)=705 nm (film)) were used in place of 0.5 parts by mass of Phthalocyanine-based dye A.

Example 8

A curable resin composition of Example 8 was prepared in the same manner as in Example 1 except that 0.5 parts by mass of a cyanine-based dye (Daito Chmix 1371F produced by Daito Chemix Corp.; maximum absorption wavelength ($\lambda_{max}$)=805 nm (film)) was used in place of 0.5 parts by mass of Phthalocyanine-based dye A.

Example 9

A curable resin composition of Example 9 was prepared in the same manner as in Example 1 except that 0.25 parts by mass of a cyanine-based dye (Daito Chmix 1371F produced by Daito Chemix Corp.; maximum absorption wavelength ($\lambda_{max}$)=805 nm (film)) and 0.25 parts by mass of a quaterrylene-based dye (Lumogen IR765 produced by BASF; maximum absorption wavelength ($\lambda_{max}$)=705 nm (film)) were used in place of 0.5 parts by mass of Phthalocyanine-based dye A.

Example 10

A curable resin composition of Example 10 was prepared in the same manner as in Example 1 except that 0.5 parts by mass of a quaterrylene-based dye (Lumogen IR765 produced by BASF; maximum absorption wavelength ($\lambda_{max}$)= 705 nm (film)) was used in place of 0.5 parts by mass of Phthalocyanine-based dye A.

Example 11

A curable resin composition of Example 11 was prepared in the same manner as in Example 1 except that 25 parts by mass of ARONIX M-305 (produced by Toagosei Co., Ltd.) was used in place of 25 parts by mass of Polymerizable compound 1.

Example 12

A curable resin composition of Example 12 was prepared in the same manner as in Example 1 except that 25 parts by mass of CYCLOMER P ACA 230AA (produced by Daicel Chemical Industries, Ltd.) was used in place of 25 parts by mass of Polymerizable compound 2.

Example 13

A curable resin composition of Example 13 was prepared in the same manner as in Example 1 except that 25 parts by mass of ARONIX M-305 (produced by Toagosei Co., Ltd.) and 25 parts by weight of CYCLOMER P ACA 230AA (produced by Daicel Chemical Industries, Ltd.) were used in place of 25 parts by mass of Polymerizable compound 1 and 25 parts by mass of Polymerizable compound 2, respectively.

Example 14

A curable resin composition of Example 14 was prepared in the same manner as in Example 1 except that 49.5 parts by mass of propylene glycol monomethyl ether (PGME) was used in place of 49.5 parts by mass of PGMEA.

<Production of Image Sensor Chip>

First, a wafer having formed thereon CMOS sensor equipped with a plurality of light-receiving elements composed of photodiode (light-receiving unit size 1.0 µm×1.0 µm) having a pixel light-receiving unit pitch of 2.0 µm and 2592 pixels (X axis direction)×1944 pixels (Y axis direction) arranged two-dimensionally at a certain arrangement pitch on a substrate, an insulating layer (silicon oxide) having a wiring layer composed of Al and a light-shielding layer, a passivation layer (silicon nitride), and a waveguide (silicon nitride) was prepared. In the COMS sensor, the thickness of the passivation layer was set to 0.3 µm, the thickness of the insulating layer intervening between the passivation layer and the waveguide was set to 0.3 µm, and the thickness of the waveguide was set to 2.1 µm. The entrance plane dimension of the waveguide was set to 1.5 µm×1.5 µm, and the exit plane dimension of the waveguide was set to 1.0 µm×1.0 µm same as the dimension of the photodiode. As a result of measuring the refractive indexes of the passivation layer, the insulating layer and the waveguide by a spectral ellipsometer, the refractive index of the passivation layer was 2.0, the refractive index of the insulating layer was 1.46, the refractive index of the waveguide was 1.88, and the refractive index of the insulating layer outside of the waveguide was 1.46. The value of the refractive index, including henceforth, is a value at a wavelength of 550 nm, unless particularly specified in the wavelength.

(Formation of Lower Planarizing Layer)

A photocurable type acrylic transparent resin material (CT-2020L produced by Fujifilm Electronic Materials Co., Ltd.) was spincoated on the passivation layer, followed by performing prebake, ultraviolet ray entire surface exposure and postbake to form a lower planarizing layer (thickness: 0.3 µm). As a result of measuring the refractive index of the lower planarizing layer in the as manner as described above, it was 1.56.

(Formation of Color Filter)

As negative type photosensitive red material (material for R), green material (material for G) and blue material (material for B), the materials described below were prepared.

Material for R: SR-4000L produced by Fujifilm Electronic Materials Co., Ltd.

Material for G: SG-4000L produced by Fujifilm Electronic Materials Co., Ltd.

Material for B: SB-4000L produced by Fujifilm Electronic Materials Co., Ltd.

The materials described above were spincoated in the formation order of G, R and B, followed by performing prebake, exposure by a ⅕ reduction type i-line stepper, development and postbake to form a color filter (film thickness: 0.8 µm). Specifically, first, Material for G was coated on the lower planarizing layer, and after performing prebake, exposure using a photomask and development, postbake (220° C. for 10 minutes) was conducted to form a green filter in a checkerboard-like pattern. Next, Material for R was coated so as to cover the green filter, and after exposure using a photomask and development, postbake (220° C. for 10 minutes) was conducted to form a red filter. Then, Material for B was coated so as to cover the red filter and the green filter, and after prebake, exposure using a photomask and development, postbake (220° C. for 10 minutes) was conducted to form a blue filter.

As the developer, a 50% diluted solution of CD-2000 produced by Fujifilm Electronic Materials Co., Ltd. was used.

As a result of measuring the refractive index of each color filter of the color filter formed in the as manner as described above, the refractive index of the red filter was 1.59 (wavelength: 620 nm), the refractive index of the green filter was 1.60 (wavelength: 550 nm), and the refractive index of the blue filter was 1.61 (wavelength: 450 nm).

(Formation of Upper Planarizing Layer)

A photocurable type acrylic transparent resin material (CT-2020L produced by Fujifilm Electronic Materials Co., Ltd.) was spincoated on the color filter, followed by conducting prebake, ultraviolet ray entire surface exposure and postbake to form an upper planarizing layer. The thickness of the upper planarizing layer formed was 0.3 µm. The refractive index of the upper planarizing layer measured in the as manner as described above was 1.56.

(Formation of Microlens)

MFR401L produced by JSR Corp. was spincoated as a microlens material on the upper planarizing layer, and prebake, exposure by a ⅕ reduction type i-line stepper, development, post exposure and melt flow by postbake were performed to form a microlens (height: 0.657 µm). As a result of measuring the refractive index of the microlens formed in the as manner as described above, it was 1.61. As the developer, 1.19% by mass solution of TMAH (tetramethylammonium hydroxide) was used.

Next, window opening of a bonding pad portion was performed. Specifically, a positive resist (positive resist for i-line PFI-27 produced by Sumitomo Chemical Co., Ltd.) was spincoated, and then, prebake, exposure using a photomask having a pattern corresponding to a bonding pad portion and a scribe portion, and development were performed. Thus, a resist pattern having apertures in the bonding pad portion and the scribe portion was formed, and oxygen ashing was performed using the resist pattern as a mask to remove the planarizing layer on the portion by etching. Then, the positive resist was removed using a resist peeling liquid.

<Formation of Dye-Containing Layer 1>

A glass substrate with a dielectric multilayer film in which the dielectric multilayer film reflecting a near infrared ray (a silica layer ($SiO_2$, film thickness: from 20 to 250 nm) and a titania layer ($TiO_2$, film thickness: from 70 to 130 nm) were alternately stacked, number of layers stacked: 44) was formed on the glass substrate at a deposition temperature of 200° C. was obtained. Each total thickness of the dielectric multilayer film was about 5.5 μm.

A coating film was formed on the glass substrate with a dielectric multilayer film using each of the curable resin compositions of Examples 1 to 14 according to a slit coat method (baker applicator YBA-3 Type produced by Yoshimitsu Seiki Co., Ltd., slit width adjusted to 250 μm), and then after performing preheating at 100° C. for 2 minutes, postheating at 140° C. for 10 minutes was conducted. A dye-containing layer having a film thickness of about 100 μm was obtained.

The glass substrate with a dielectric multilayer film having the dye-containing layer formed was stuck on the solid-state imaging device substrate obtained above using an adhesive.

Subsequently, dicing of the wafer was performed, the package assembly was conducted to produce a solid-state imaging device according to the invention.

<Formation of Dye-Containing Layer 2>

Further, a coating film was formed on a glass substrate using each of the curable resin compositions of Examples 1 to 14 according to a slit coat method, and then after performing preheating at 100° C. for 2 minutes, postheating at 140° C. for 10 minutes was conducted. A dye-containing layer having a film thickness of about 100 μm was obtained.

A dielectric multilayer film in which the dielectric multilayer film reflecting a near infrared ray (a silica layer ($SiO_2$, film thickness: from 20 to 250 nm) and a titania layer ($TiO_2$, film thickness: from 70 to 130 nm) were alternately stacked, number of layers stacked: 44) was formed on the surface of the dye-containing layer of the glass substrate having the dye-containing layer formed at a deposition temperature of 200° C. Each total thickness of the dielectric multilayer film was about 5.5 μm.

The glass substrate having the dielectric multilayer film formed on the dye-containing layer was stuck on the solid-state imaging device substrate obtained above using an adhesive.

Subsequently, dicing of the wafer was performed, the package assembly was conducted to produce a solid-state imaging device according to the invention.

<Evaluation of Image Sensor Chip>
(Measurement and Evaluation of Incident Angle Dependence)

A camera lens was combined with the solid-state imaging device thus-produced, and taking sensitivity in the valid imaging region (chief ray incident angle: 0°) as 100%, relative sensitivity in each green pixel was measured at the chief ray incident angle of 5°, 10°, 15°, 20°, 25° and 30°. It was confirmed from the results that the shading was inhibited.

Further, the improvement in the heat resistance was also confirmed by increasing the film thickness of the dye-containing layer.

The solid-state imaging devices were obtained in the same manner as above except that the film thicknesses of Dye-containing layer 1 and Dye-containing layer 2 were changed to 60 μm, 200 μm, 250 μm and 300 μm, respectively. It was confirmed that these solid-state imaging devices also had sufficient near infrared ray shielding property and heat resistance. It was confirmed that the sufficient heat resistance was obtained in the case where the film thickness was 100 μm or more, but it was found that the image quality of the image sensor became insufficient in the case where the film thickness was 300 μm.

Example 15

Preparation of First Curable Resin Composition Having Near Infrared Ray Absorbing Property A first curable resin composition having near infrared ray absorbing property was prepared by mixing the compounds described below.

(Preparation of Polymer Type Copper Sulfonate Complex X)

Water (60 parts by mass) was charged in a three-necked flask, and the temperature was raised to 57° C. under a nitrogen atmosphere. A monomer solution (Dropping solution a) prepared by dissolving 2-acrylamido-2-methylpropanesulfonic acid (100 parts by mass) in water (160 parts by weight) and an initiator solution (Dropping solution b) prepared by dissolving VA-046B (water-soluble azo-based polymerization initiator produced by Wako Pure Chemical Industries, Ltd., 1.164 parts by mass) in water (80 parts by mass) were prepared, and Dropping solution a and Dropping solution b were dropwise added simultaneously over a period of 2 hours to be reacted. After the completion of the dropwise addition, the mixture was reacted for 2 hours, the temperature was raised to 65° C., and further reacted for 2 hours, thereby obtaining a 25% by mass aqueous solution of Polymer (B-1). The weight average molecular weight thereof was 100,000.

To the solution of (B-1) was added 0.4 equivalent of copper (II) hydroxide (18.83 parts by mass) to the acid group amount of (B-1), the mixture was stirred at 50° C. for one hour and then diluted with water to obtain a 25% by mass aqueous solution of Polymer type copper sulfonate complex X.

(Preparation of First Resin Composition Having Near Infrared Ray Absorbing Property)

Pure water (2.80 g) and dimethylformamide (1.20 g) were added to Polymer type copper sulfonate complex X (1.00 g) to obtain a first curable resin composition. The first curable resin composition prepared was a blue transparent liquid having a solid content concentration of 20% by mass.

<Preparation of Second Curable Resin Composition Having Near Infrared Ray Absorbing Property>

A second curable resin composition having near infrared ray absorbing property was prepared by mixing the compounds described below.

(Synthesis of Pyrrolopyrrole dye compound (A-154))

According to the scheme shown below, Pyrrolopyrrole dye compound (A-154) was synthesized.

[Chem. 13]
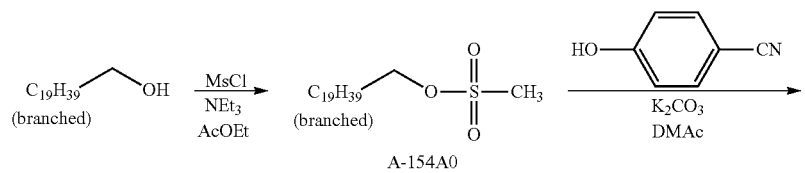
A-154A0
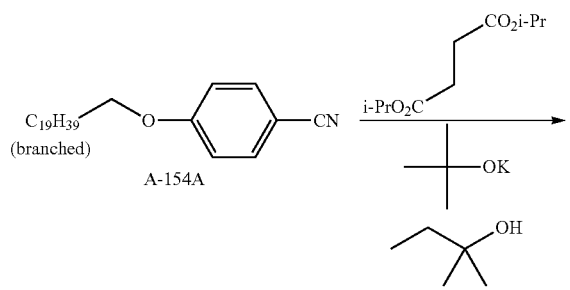
A-154A
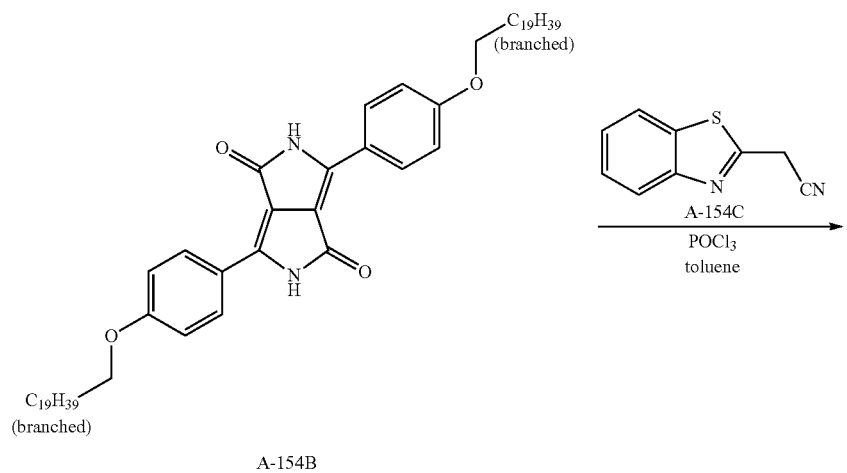
A-154B
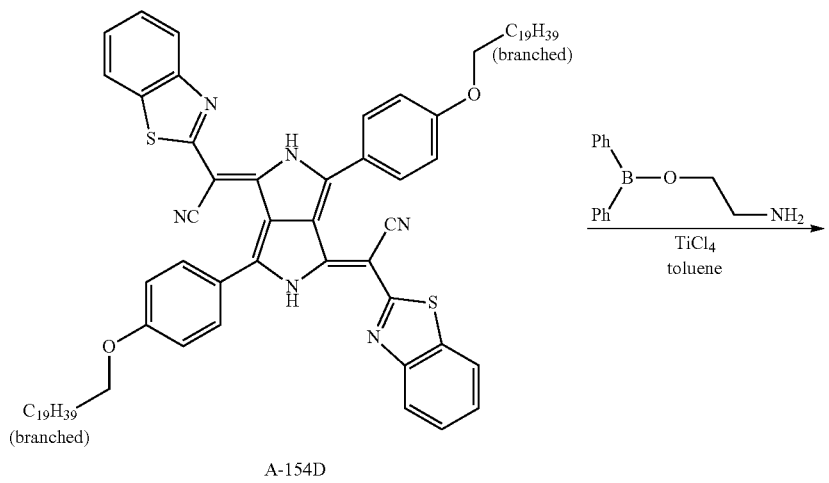
A-154D

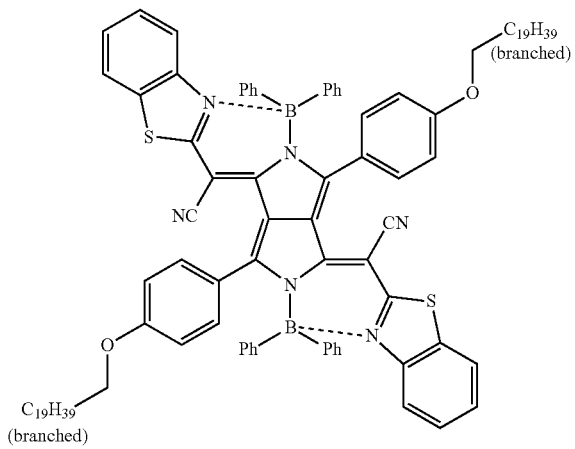

A-154

In 40 parts by mass of ethyl acetate were mixed 20.0 parts by mass of Isoeicosanol (FINEOXOCOL 2000 produced by Nissan Chemical Industries, Ltd.) and 8.13 parts by mass of triethylamine, and under −10° C., 8.44 parts by mass of methanesulfonyl chloride was added dropwise thereto. After the completion of the dropwise addition, the mixture was reacted at 30° C. for 2 hours. The organic phase was collected by a liquid separation operation, and the solvent was distilled off under a reduced pressure to obtain 25.5 parts by mass of a pale yellow liquid (A-154A0 form).

In 25 parts by mass of dimethylacetamide were stirred 7.82 parts by mass of 4-cyanophenol and 10.1 parts by mass of potassium carbonate, 25.5 parts by mass of A-154A0 form synthesized above was added thereto, and the mixture was reacted at 100° C. for 6 hours. The organic phase was collected by a liquid separation operation, the organic phase was washed with an aqueous sodium hydroxide solution, and the solvent was distilled off under a reduced pressure to obtain 25.8 parts by mass of a pale yellow liquid (A-154A form).

$^1$H-NMR (CDCl$_3$): δ 0.55-0.96 (m, 18H), 0.96-2.10 (m; 21H), 3.88 (m, 2H), 6.93 (d, 2H), 7.56 (d, 2H)

Diketopyrrolopyrrole compound (A-154B form) was synthesized using 13.1 parts by mass of A-154A form synthesized above as the raw material in accordance with the method described in U.S. Pat. No. 5,969,154 to obtain 7.33 parts by mass of an orange solid (A-154B form).

$^1$H-NMR (CDCl$_3$): δ 0.55-0.96 (m, 36H), 0.96-2.10 (m; 42H), 3.95 (m, 4H), 7.06 (d, 4H), 8.30 (d, 4H), 8.99 (brs, 2H)

In 30 parts by mass of toluene were stirred 7.2 parts by mass of A-154B form and 3.42 parts by mass of 2-(2-benzothizolyl)acetonitrile, 10.0 parts by mass of phosphorus oxychloride was added thereto, and the mixture was refluxed by heating for 5 hours. The organic phase was collected by a liquid separation operation and washed with an aqueous sodium hydrogen carbonate solution, and the solvent was distilled off under a reduced pressure.

The crude product was purified by silica gel column chromatography (solvent: chloroform), and further recrystallized from a chloroform/acetonitrile solvent to obtain 5.73 parts by mass of a green solid (A-154D form).

$^1$H-NMR (CDCl$_3$): δ 0.55-1.00 (m, 36H), 1.00-2.10 (m; 42H), 3.97 (m, 4H), 7.11 (d, 4H), 7.28 (t, 2H), 7.43 (t, 2H), 7.67-7.75 (m, 6H), 7.80 (d, 2H), 13.16 (s, 2H)

In 70 parts by mass of toluene was stirred 2.53 parts by mass of 2-aminoethyl diphenylborinate at 40° C., 3.56 parts by mass of titanium chloride was added thereto, and the mixture was reacted for 30 minutes. Then, 5.60 parts by mass of A-154D form was added thereto, and the mixture was refluxed by heating at an external temperature of 130° C. for one hour. The mixture was cooled to room temperature, 80 parts by mass of methanol was added thereto to deposit crystals, and the crystals were collected by filtration. The crude crystals obtained were purified by silica gel column chromatography (solvent: chloroform), and further recrystallized from a toluene/methanol solvent to obtain 3.87 parts by mass of the desired compound (A-154) as green crystals.

The λmax of Compound (A-154) was 780 nm in chloroform. The molar absorption coefficient thereof was 2.21×10$^5$ dm$^3$/mol·cm in chloroform.

$^1$H-NMR (CDCl$_3$): δ 0.55-1.01 (m, 36H), 1.01-2.10 (m; 42H), 3.82 (m, 4H), 6.46 (s, 8H), 6.90-7.05 (m, 6H), 7.07-7.19 (m, 12H), 7.21-7.29 (m, 8H), 7.32 (d, 2H)

(Synthesis of Polymerizable Compound (Resin (B-1)))

Under a nitrogen atmosphere, 33.26 parts by mass of cyclohexanone was heated to 85° C. A mixed solution of 22.36 parts by mass of glycidyl methacrylate, 12.38 parts by mass of 1,1,1,3,3,3-hexafluoroisopropyl methacrylate, 33.26 parts by mass of cyclohexanone and 1.45 parts by mass of dimethyl 2,2'-azobisisobutyrate (V-601 produced by Wako Pure Chemical Industries, Ltd.) was added dropwise thereto with stirring over a period of 2 hours. After the completion of the dropwise addition, the mixture was stirred further at 85° C. for 2 hours and further 90° C. for 2 hours to obtain Resin (B-1). The weight average molecular weight (Mw: calculated in terms of polystyrene) of the resin obtained determined by GPC (carrier: tetrahydrofuran (THF)) was 13,300, and a degree of dispersion (Mw/Mn) was 2.26.

[Chem. 14]

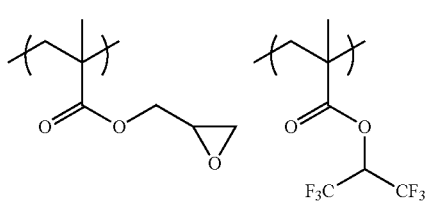
(B-1)

(Second Curable Resin Composition Having Near Infrared Ray Absorbing Property)

A second curable resin composition having near infrared ray absorbing property was prepared by mixing the components described below.

| | |
|---|---|
| Pyrrolopyrrole dye compound (A-154) | 2.40 parts by mass |
| Polymerizable compound: Resin (B-1) | 6.80 parts by mass |
| Polymerizable compound: EHPE 3150 (produced by Daicel Chemical Industries, Ltd.) | 14.5 parts by mass |
| Curing agent: Pyromellitic anhydride | 3.50 parts by mass |
| Polymerization inhibitor: p-Methoxyphenol | 0.10 parts by mass |
| Solvent: Cyclohexanone | 72.65 parts by mass |
| Surfactant: MEGAFAC F-781-F (produced by DIC Corp.) | 0.05 parts by mass |

<Formation of Near Infrared Ray Cut Filter>

A near infrared ray cut filter was produced in the method described below using the first curable resin composition having near infrared ray absorbing property and the second curable resin composition having near infrared ray absorbing property prepared.

The second curable resin composition having near infrared ray absorbing property was coated (2,000 rpm, 20 seconds) by spin coat (using Spin Coater 1H-D7 produced by Mikasa Co., Ltd.) on a glass substrate, and prebaked at 100° C. for 2 minutes and postbaked at 230° C. for 5 minutes by a hot plate. The first curable resin composition having near infrared ray absorbing property was coated thereon by an applicator coating method (slit width: 400 μm), and prebaked at 100° C. for 30 minutes and postbaked at 120° C. for 15 minutes in an oven, thereby producing a near infrared ray cut filter. The film thickness of the near infrared ray cut filter obtained was 148.4 μm. The film thickness of layer formed by the second curable resin composition was 1.2 μm.

<Evaluation of Near Infrared Ray Shielding Property>

A spectral transmittance of the near infrared ray cut filter obtained as described above was measured by using a spectrophotometer U-4100 (produced by Hitachi High-Technologies Corp.). It was confirmed from the results that the near infrared ray cut filter which sufficiently shielded light in the near infrared region and in which the incident angle dependence was reduced was able to be provided.

Example 16

Synthesis of Pyrrolopyrrole Dye and Production of Aqueous Dispersion of the Same (Preparation of Pyrrolopyrrole Dye Compound (D-17))

Pyrrolopyrrole dye compound (D-17) was prepared according to Scheme 1 shown below in the same manner as in Synthesis Example 1 of the example of JP-A-2011-68731.

Scheme 1

[Chem. 15]

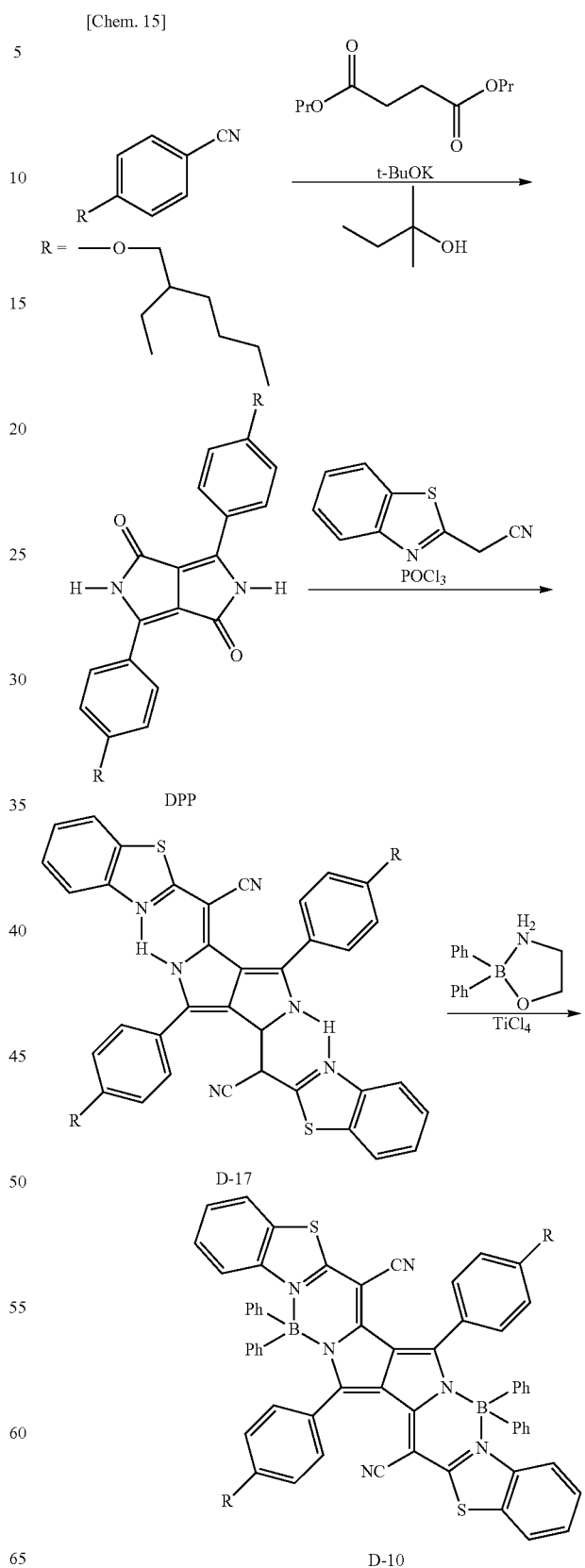

¹H-NMR (CDCl₃): δ 0.9-1.0 (m, 12H), 1.35-1.6 (m; 16H), 1.8 (m, 2H), 3.95 (d, 4H), 7.1 (d, 4H), 7.4-7.5 (m, 4H), 7.7 (d, 4H), 7.75 (d, 2H), 8.0 (d, 2H)

(Preparation of Pyrrolopyrrole Dye Compound (D-10))

Pyrrolopyrrole dye compound (D-10) was prepared according to Scheme 1 described above in the same manner as in Synthesis Example 2 of the example of JP-A-2011-68731.

The λmax of Compound (D-10) was 779 nm in chloroform. The molar absorption coefficient thereof was 2.06×10⁵ dm³/mol·cm in chloroform.

¹H-NMR (CDCl₃): δ 0.9-1.0 (m, 12H), 1.35-1.6 (m; 16H), 1.8 (m, 2H), 3.85 (d, 4H), 6.45 (s, 8H), 7.0 (d, 4H), 7.15 (m, 12H), 7.2 (m, 2H), 7.25 (m, 4H+4H), 7.5 (m, 2H)

(Preparation of Pyrrolopyrrole Dye Compound (D-141A))

Pyrrolopyrrole dye compound (D-141A) described below was prepared in the same manner as Pyrrolopyrrole dye compound (D-10) except for changing the starting material.

[Chem. 16]

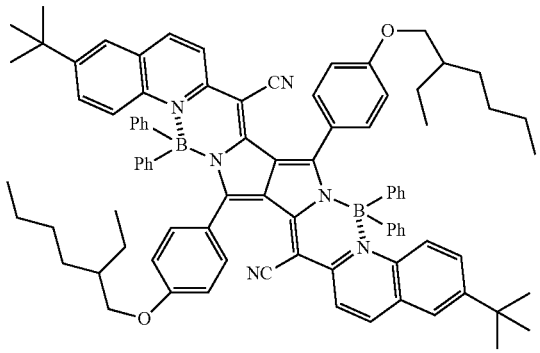

D-141A (Production of Aqueous Dispersion of Pyrrolopyrrole Dye Fine Particle)

To any one kind of the pyrrolopyrrole dye compounds described above (6 parts by mass) and a dispersing agent (DISPERBYK 191 produced by BYK Chemie GmbH (4 parts by mass) was added a dispersion medium: water (90 parts by mass)) to make 100 parts by mass. Further, 100 parts by mass of zirconia beads of 0.1 mmϕ was added thereto, and the mixture was treated by a planetary ball mill at 300 rpm for 8 hours. The beads were separated by filtration to produce an aqueous dispersion of pyrrolopyrrole dye fine particle composed of fine particles.

<Preparation of Curable Resin Composition Having Near Infrared Ray Absorbing Property>

A curable resin composition having near infrared ray absorbing property was prepared by mixing the compounds described below.

To a copper complex having a sulfonic acid as a ligand represented by A-1 shown below (2.50 g) were added a 50% by mass aqueous solution of polyacrylamide (AQ Nylon A-90 produced by Toray Industries, Inc.) (5.00 g) and the aqueous dispersion of pyrrolopyrrole dye fine particle described above (2.50 g) to obtain a curable resin composition having near infrared ray absorbing property having copper sulfonate complex:pyrrolopyrrole dye fine particle: other solid content=50:3:52 and a solid content concentration of 52.5% by mass. The curable resin composition having near infrared ray absorbing property prepared was a blue transparent liquid.

TABLE 2

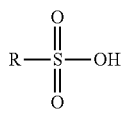

| Sulfonic acid | R |
| --- | --- |
| A-1 | —CH₃ |
| A-2 | —CF₃ |
| A-3 | ![vinyl] |
| A-4 | ![o-methoxycarbonylphenyl H₃COOC] |

<Production of Near Infrared Ray Cut Filter>

The composition having near infrared ray absorbing property prepared in Example 16 was coated on a glass substrate using an applicator coating method (baker applicator YBA-3 Type produced by Yoshimitsu Seiki Co., Ltd., slit width adjusted to 250 μm, 400 μm), prebaked in an oven at 100° C. for 30 minutes, and further postbaked in an oven at 120° C. for 15 minutes, thereby producing a near infrared ray cut filter. The film thickness of the near infrared ray cut filter obtained was 151.5 μm.

<Evaluation of Near Infrared Ray Shielding Property>

A spectral transmittance of the near infrared ray cut filter obtained as described above was measured by using a spectrophotometer U-4100 (produced by Hitachi High-Technologies Corp.). It was confirmed from the results that the near infrared ray cut filter which sufficiently shielded light in the near infrared region and in which the incident angle dependence was reduced was able to be provided.

Near infrared ray cut filters were obtained in the same manner as in Examples 15 and 16 except that the film thickness of the copper complex-containing layer in Examples 15 and 16 was changed to 60 μm, 100 μm, 200 μm and 250 μm, respectively. It was confirmed that these infrared ray cut filters also had the sufficient near infrared ray shielding property.

Near infrared ray cut filters were produced in the same manner as in Example 16 except that Sulfonic acid A-1 in Example 16 was changed to Sulfonic acids A-2 to A-4, respectively. Further, a near infrared ray cut filter was produced in the same manner as in Example 16 except that Pyrrolopyrrole dye D-10 in Example 16 was changed to Pyrrolopyrrole dye D-141A. It was confirmed that these near infrared ray cut filters were also able to provide the near infrared ray cut filter which sufficiently shielded light in the near infrared region and in which the incident angle dependence was reduced. In these examples, by adding the pyrrolopyrrole dye, the near infrared ray absorbing ability in the vicinity of the maximum absorption wavelength of the dye was able to be further increased.

INDUSTRIAL APPLICABILITY

According to the invention, a curable resin composition capable of producing an image sensor chip in which the color shading is suppressed can be provided.

Also, a curable resin composition which can produce an image sensor chip in which a stack functioning as an infrared ray cut filter and including, for example, a dye-containing layer and an infrared ray reflecting film and a surface of a solid-state imaging device substrate are closely contacted with each other without a space and by which the incident angle dependence of light received can be suppressed, a production method of image sensor chip using the same, and an image sensor chip can be provided.

Although the invention has been described in detail and by reference to specific embodiments, it is apparent to those skilled in the art that it is possible to add various alterations and modifications insofar as the alterations and modifications do not deviate from the spirit and the scope of the invention.

This application is based on a Japanese patent application filed on Nov. 30, 2012 (Japanese Patent Application No. 2012-263644), and the contents thereof are incorporated herein by reference.

DESCRIPTION OF REFERENCE NUMERALS AND SIGNS

10: Silicon substrate
12: Imaging device
13: Interlayer insulating film
14: Base layer
15: Color filter
16: Overcoat
17: High refractive index layer
18: Light-shielding film
20: Adhesive
22: Insulating film
23: Metal electrode
24: Solder resist layer
26: Internal electrode
27: Device surface electrode
30: Glass substrate
35: Infrared ray reflecting film
40: Imaging lens
42: Dye-containing layer
44: Light-shielding and electromagnetic shield
45: Adhesive
46: Low refractive index layer
50: Lens holder
60: Solder ball
70: Circuit board
100: Solid-state imaging device substrate
200: Camera module

The invention claimed is:

1. A curable resin composition which is capable of being coated so as to have a film thickness of 20 µm or more and contains a dye having a maximum absorption wavelength in a wavelength range from 600 to 850 nm and a surfactant,
   which has a solid content concentration from 10 to 90% by mass and a viscosity at 25° C. from 1 mPa·s to 1,000 Pa·s.

2. The curable resin composition as claimed in claim 1, wherein the dye is at least one dye selected from the group consisting of a pyrrolopyrrole dye, a copper complex, a cyanine-based dye, a phthalocyanine-based dye, a quaterrylene-based dye, an aminium-based dye, an imminium-based dye, an azo-based dye, an anthraquinone-based dye, a diimonium-based dye, a squarylium-based dye and a porphyrin-based dye.

3. The curable resin composition as claimed in claim 1, wherein the dye is a pyrrolopyrrole dye or a copper complex.

4. The curable resin composition as claimed in claim 1, which further contains a polymerizable compound and a solvent, and the content of the dye in the total solids content of the composition is 30% by mass or more.

5. An infrared ray cut filter having a dye-containing layer having a film thickness of 20 µm or more formed from the curable resin composition as claimed in claim 1.

6. A production method of image sensor chip comprising a step of coating the curable resin composition as claimed in claim 1 on a glass substrate to form a dye-containing layer, and a step of adhering the glass plate having the dye-containing layer formed on a solid-state imaging device substrate.

7. The production method of image sensor chip as claimed in claim 6,
   wherein the coating of the curable resin composition is applicator coating and the applicator coating is performed by setting the solids content concentration and the viscosity of the curable resin composition to from 40 to 70% by mass and 300 to 700 mPa·s, respectively.

8. The production method of image sensor chip as claimed in claim 6,
   wherein the glass substrate further has an infrared ray reflecting film, and (1) a surface of the glass substrate on which the infrared ray reflecting film is formed is adhered on the solid-state imaging device substrate or (2) a surface of the glass substrate on which the infrared ray reflecting film is not formed is adhered on the solid-state imaging device substrate.

9. The production method of image sensor chip as claimed in claim 8,
   wherein the infrared ray reflecting film is a dielectric multilayer film.

10. The production method of image sensor chip as claimed in claim 6, wherein the glass substrate further has an antireflection film.

11. The production method of image sensor chip as claimed in claim 10,
    wherein the infrared ray reflecting film is present on one surface of the glass substrate and the antireflection film is present on the other surface of the glass substrate.

12. The production method of image sensor chip as claimed in claim 6,
    wherein the solid-state imaging device substrate has a color filter layer, a high refractive index layer and a low refractive index layer.

13. An image sensor chip comprising a solid-state imaging device substrate, a dye-containing layer composed of the curable resin composition as claimed in claim 1 and a glass substrate having an infrared ray reflecting film, wherein these are closely contacted with each other without intervention of an air layer.

14. The image sensor chip as claimed in claim 13,
    wherein the infrared ray reflecting film is provided on a surface of the glass substrate opposed to the dye-containing layer composed of the curable resin composition.

15. The image sensor chip as claimed in claim 13,
    wherein the dye-containing layer is provided between the infrared ray reflecting film and the glass substrate.

16. The image sensor chip as claimed in claim 13,
    wherein an antireflection film is further provided on an outermost surface of the image sensor chip comprising the solid-state imaging device substrate, the dye-containing layer and the infrared ray reflecting film.

17. The curable resin composition as claimed in claim 1, which further contains a polymerizable compound.

18. The curable resin composition as claimed in claim 17, wherein the polymerizable compound is a compound having two or more epoxy groups or oxetanyl groups in its molecule.

19. The curable resin composition as claimed in claim 17, wherein the polymerizable compound is a compound having two or more terminal ethylenically unsaturated bonds.

20. The curable resin composition as claimed in claim 1, which further contains an alkali-soluble resin as a binder.

21. The curable resin composition as claimed in claim 1, wherein the content of the surfactant is from 0.01 to 1% by mass, based on the total solid content mass of the curable resin composition.

22. The curable resin composition as claimed in claim 1, wherein the surfactant is a fluorine-based surfactant, and the fluorine content in the fluorine-based surfactant is from 3 to 40% by mass.

23. The curable resin composition as claimed in claim 1, which further contains a binder, and the content of the binder in the curable resin composition is from 1 to 20% by mass, based on the total solids content of the composition.

24. The curable resin composition as claimed in claim 1, wherein the viscosity of the curable resin composition is from 1 to 500 mPa·s.

25. The curable resin composition as claimed in claim 1, wherein the viscosity of the curable resin composition is from 20 to 100 mPa·s.

26. An infrared ray cut filter having a first dye-containing layer containing a copper complex and a second dye-containing layer containing a surfactant and a pyrrolopyrrole dye,
wherein the surfactant is a fluorine-based surfactant, and the fluorine content in the fluorine-based surfactant is from 3 to 40% by mass.

27. The infrared ray cut filter as claimed in claim 26,
wherein the film thickness of the first dye-containing layer is 50 μm or more and the film thickness of the second dye-containing layer is 5 μm or less.

28. The infrared ray cut filter according to claim 26, wherein the first and second dye-containing layers are prepared from first and second curable resin compositions, respectively, and the content of the surfactant is from 0.01 to 1% by mass, based on the total solid content mass of the curable resin compositions which contain surfactant.

29. A curable resin composition which is capable of being coated so as to have a film thickness of 20 μm or more and contains a dye having a maximum absorption wavelength in a wavelength range from 600 to 850 nm and a polymerizable compound having two or more epoxy groups or oxetanyl groups in its molecule,
which has a solid content concentration from 10 to 90% by mass and a viscosity at 25° C. from 1 mPa·s to 1,000 Pa·s.

30. A production method of image sensor chip comprising a step of coating the curable resin composition as claimed in claim 29 on a glass substrate to form a dye-containing layer, and a step of adhering the glass plate having the dye-containing layer formed on a solid-state imaging device substrate.

31. An image sensor chip comprising a solid-state imaging device substrate, a dye-containing layer composed of the curable resin composition as claimed in claim 29 and a glass substrate having an infrared ray reflecting film, wherein these are closely contacted with each other without intervention of an air layer.

32. A curable resin composition which is capable of being coated so as to have a film thickness of 20 μm or more and contains a dye having a maximum absorption wavelength in a wavelength range from 600 to 850 nm and an alkali-soluble resin as a binder,
which has a solid content concentration from 10 to 90% by mass and a viscosity at 25° C. from 1 mPa·s to 1,000 Pa·s.

33. A production method of image sensor chip comprising a step of coating the curable resin composition as claimed in claim 32 on a glass substrate to form a dye-containing layer, and a step of adhering the glass plate having the dye-containing layer formed on a solid-state imaging device substrate.

34. An image sensor chip comprising a solid-state imaging device substrate, a dye-containing layer composed of the curable resin composition as claimed in claim 32 and a glass substrate having an infrared ray reflecting film, wherein these are closely contacted with each other without intervention of an air layer.

* * * * *